US011988717B2

(12) United States Patent
Takahashi

(10) Patent No.: US 11,988,717 B2
(45) Date of Patent: May 21, 2024

(54) MEASUREMENT APPARATUS OF POWER STORAGE DEVICE AND MEASUREMENT METHOD

(71) Applicant: HIOKI E.E. CORPORATION, Ueda (JP)

(72) Inventor: Tetsuya Takahashi, Ueda (JP)

(73) Assignee: HIOKI E.E. CORPORATION, Ueda (JP)

(*) Notice: Subject to any disclaimer, the term of this patent is extended or adjusted under 35 U.S.C. 154(b) by 0 days.

(21) Appl. No.: 17/597,934

(22) PCT Filed: Apr. 15, 2020

(86) PCT No.: PCT/JP2020/016582
§ 371 (c)(1),
(2) Date: Jan. 28, 2022

(87) PCT Pub. No.: WO2021/019848
PCT Pub. Date: Feb. 4, 2021

(65) Prior Publication Data
US 2022/0291290 A1    Sep. 15, 2022

(30) Foreign Application Priority Data

Jul. 30, 2019   (JP) .................................. 2019-139656
Jul. 30, 2019   (JP) .................................. 2019-139659

(51) Int. Cl.
*G01R 31/3835*   (2019.01)
*G01R 19/12*     (2006.01)
*G01R 31/36*     (2020.01)

(52) U.S. Cl.
CPC ......... *G01R 31/3835* (2019.01); *G01R 19/12* (2013.01); *G01R 31/3648* (2013.01)

(58) Field of Classification Search
CPC ............................ G01R 31/3835; G01R 19/12
USPC ........................................................... 702/63
See application file for complete search history.

(56) References Cited

U.S. PATENT DOCUMENTS

| 2002/0075003 | A1 | 6/2002 | Fridman et al. |
| 2010/0004885 | A1 | 1/2010 | Nakanishi |
| 2010/0188054 | A1 | 7/2010 | Asakura et al. |
| 2011/0307202 | A1* | 12/2011 | Benjamin ........ G01R 19/16542 |
| | | | 702/63 |
| 2015/0039255 | A1* | 2/2015 | Stewart ................. H02J 7/0029 |
| | | | 702/63 |
| 2016/0190831 | A1 | 6/2016 | Mori et al. |

(Continued)

FOREIGN PATENT DOCUMENTS

| EP | 1293377 A2 | 3/2003 |
| JP | 200545950 A | 2/2005 |

(Continued)

OTHER PUBLICATIONS

International Search Report and Written Opinion for WPO Patent Application No. JP2020/016582 dated Jul. 7, 2020, 12 pages.

*Primary Examiner* — Ricky Go
(74) *Attorney, Agent, or Firm* — Jordan IP Law, LLC

(57) ABSTRACT

A measurement apparatus of a power storage device supplies constant current to the power storage device, measures voltage of the power storage device, and computes an internal state of the power storage device on the basis of voltage change in the power storage device subjected to the measurement.

14 Claims, 8 Drawing Sheets

(56) References Cited

U.S. PATENT DOCUMENTS

| | | | |
|---|---|---|---|
| 2016/0252586 A1* | 9/2016 | Shimura | G01R 31/389 |
| | | | 702/63 |
| 2017/0030975 A1* | 2/2017 | Ueno | G01R 31/392 |
| 2019/0077265 A1* | 3/2019 | Ono | H01M 10/482 |
| 2019/0170831 A1 | 6/2019 | Sada | |
| 2019/0198942 A1 | 6/2019 | Kobayashi et al. | |

FOREIGN PATENT DOCUMENTS

| | | |
|---|---|---|
| JP | 2008123961 A | 5/2008 |
| JP | 2008-288192 A | 11/2008 |
| JP | 2012141166 A | 7/2012 |
| JP | 2015072148 A | 4/2015 |
| JP | 2016122531 A | 7/2016 |
| JP | 2019-113450 A | 7/2019 |
| JP | 2019113469 A | 7/2019 |
| WO | 2009013898 A1 | 1/2009 |

\* cited by examiner

MEASUREMENT APPARATUS OF POWER STORAGE DEVICE AND MEASUREMENT METHOD

CROSS REFERENCE TO RELATED APPLICATIONS

The present application is a U.S. National Phase Patent Application, which claims the benefit of priority to International Patent Application No. PCT/JP2020/016582 filed on Apr. 15, 2020, which itself claims the priority of Japanese Patent Application No. 2019-139656 filed on Jul. 30, 2019 and 2019-139659 filed on Jul. 30, 2019, which are each hereby incorporated by reference in their respective entireties.

TECHNICAL FIELD

The present invention relates to a measurement apparatus of a power storage device and a measurement method.

BACKGROUND ART

JP2015-072148A discloses an inspection method in which a pass/fail determination of a secondary battery is performed on the basis of a lowered amount of voltage of the secondary battery during an aging time. In this inspection method, the pass/fail determination of the secondary battery is performed by storing the secondary battery for a period of several days to several weeks in a state in which a positive electrode and a negative electrode are opened and by measuring the voltage after the voltage has been lowered due to self discharge.

SUMMARY OF INVENTION

However, in the technique disclosed by JP2015-072148A, it is necessary to store the power storage device for several days to several weeks until the voltage of the power storage device such as the secondary battery is lowered. Therefore, with the above-described technique, there is a problem in that it takes time to estimate a state of the power storage device.

The present invention has been conceived in light of the problems mentioned above, and an object thereof is to estimate a state of a power storage device within a short time.

According to an aspect of the present invention, the measurement apparatus of the power storage device is provided with the constant current supply means configured to supply the constant current to the power storage device; voltage measuring means configured to measure the voltage of the power storage device; and control means configured to compute an internal state of the power storage device based on the voltage change in the power storage device subjected to measurement.

According to another aspect of the present invention, the measurement method of the power storage device includes a step of supplying the constant current to the power storage device, a step of measuring the voltage of the power storage device, and a step of computing an internal state of the power storage device based on the voltage change in the power storage device subjected to measurement.

According to these aspects, because the constant current is supplied to the power storage device 10, compared with a state in which the constant current is not supplied to the power storage device 10, it is possible to enhance the voltage change in the power storage device 10. Thus, the controller 4 can readily detect the voltage change in the power storage device 10, and so, it is possible to estimate the state of the power storage device within a short time.

DESCRIPTION OF EMBODIMENTS

First Embodiment

In the following, an inspection apparatus of a power storage device 10 according to a first embodiment of the present invention (hereinafter, simply referred to as "an inspection apparatus") 1 will be described with reference to FIGS. 1 to 3.

A configuration of the power storage device 10 and a configuration of the inspection apparatus 1 will be described first with reference to FIG. 1. FIG. 1 is a diagram showing the configuration of the inspection apparatus 1.

The power storage device 10 is a single power storage cell of a lithium ion secondary battery, for example. The power storage device 10 is not limited to the secondary battery (chemical battery), and for example, it may be an electric double-layer capacitor. In addition, the power storage device 10 may also be a power storage module in which a plurality of power storage cells are connected in series.

Figure 1:
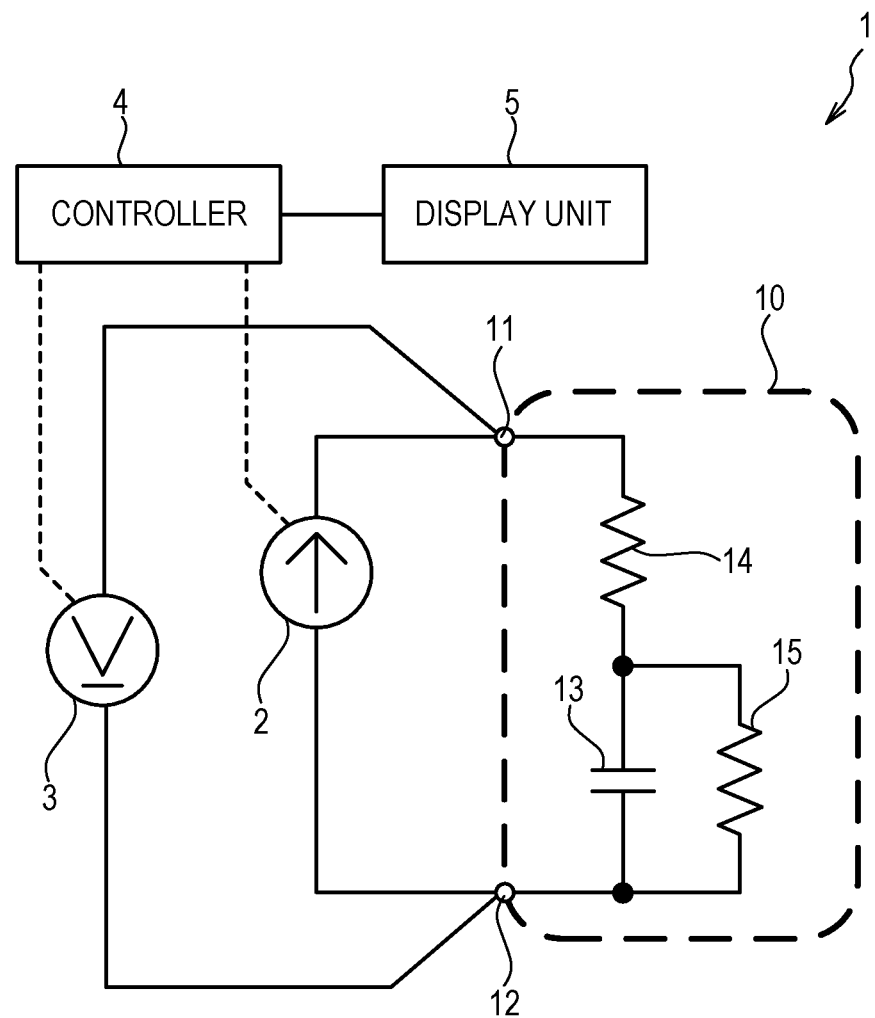
FIG. 1 is a diagram showing a configuration of an inspection apparatus for a power storage device according to a first embodiment of the present invention.

As shown in FIG. 1, the power storage device 10 is shown by an equivalent circuit model. According to the equivalent circuit model, the power storage device 10 has a positive electrode 11, a negative electrode 12, a power storage unit 13, an internal resistance 14, and a parallel resistance 15.

When a voltage higher than the cell voltage of the power storage device 10 is applied, charge is accumulated and the power storage unit 13 is charged. In the power storage unit 13, when the flowing current is relatively low and the applied voltage is lower than the overpotential during the charging, an electrical double layer reaction is caused, and the flowing current is relatively high and the applied voltage exceeds the overpotential during the charging, a chemical reaction is caused. The overpotential of the power storage device 10 in this description refers to, in an electrochemical reaction, the difference between the thermodynamically determined theoretical potential (the equilibrium electrode potential) of the reaction and the potential of the positive electrode 11 at which the reaction is actually taking place. In this description, the electrostatic capacitance of the power storage unit 13 is referred to as Cst [F] and the current flowing in the power storage unit 13 is referred to as Ist [A].

The internal resistance 14 is a series resistance that is connected to the power storage unit 13 in series between the positive electrode 11 and the negative electrode 12. In this description, the resistance value of the internal resistance 14 is referred to as Rir [m Ω] and the current flowing through the internal resistance 14 is referred to as Iir [A].

The parallel resistance 15 is discharge resistance that is connected to the power storage unit 13 in parallel. A self-discharge current that is a so-called leakage current flows through the parallel resistance 15. In this description, the resistance value of the parallel resistance 15 is referred to as Rpr [k Ω] and the current flowing through the parallel resistance 15 is referred to as Ipr [A].

The inspection apparatus 1 is a measurement apparatus for measuring a state of the power storage device 10, and in this embodiment, the internal state of the power storage device 10 is specified by performing an inspection of the self discharge in the power storage device 10. In other words, the inspection apparatus 1 in this embodiment is an apparatus for inspecting whether or not the power storage device 10 is normal. The inspection apparatus 1 is provided with a constant-current source 2 serving as the constant current supply means, a voltage sensor 3 serving as voltage measuring means, a controller 4 serving as control means, and a display unit 5.

The constant-current source 2 is a DC power supply (a current generator) that charges the power storage device 10 by supplying constant current to the power storage device 10 for detecting the self-discharge current. The constant-current source 2 maintains the current from the power supply flowing in the power storage device 10 at a predetermined level. The constant-current source 2 charges the power storage device 10 by supplying the constant current at a level that is lower than the overpotential and at which the electrical double layer reaction is mainly caused in the power storage device 10. At this time, the constant current supplied from the constant-current source 2 is 10 [μA], for example.

In a case in which the power storage device 10 is charged by applying a constant voltage to the power storage device 10, it is difficult to stably apply the constant voltage at a level that is lower than the overpotential and at which the electrical double layer reaction is mainly caused in the power storage device 10. In contrast, it is easier to supply a relatively low current by using the constant-current source 2. Thus, in the inspection apparatus 1, by using the constant-current source 2, it is possible to stably supply the constant current at a level that is lower than the overpotential and at which the electrical double layer reaction is mainly caused in the power storage device 10.

The voltage sensor 3 is a measuring instrument that measures the voltage of the power storage device 10. The voltage sensor 3 measures the voltage of the power storage device 10 at least twice including once in a state in which the constant current is supplied from the constant-current source 2. The voltage sensor 3 outputs an electric signal corresponding to the detected voltage value of the power storage device 10 to the controller 4.

The controller 4 is formed of a microcomputer provided with a central processing unit (CPU) serving as a processor, a read-only memory (ROM), a random-access memory (RAM), and an input-output interface (I/O interface). The controller 4 controls various operations of the inspection apparatus 1 by reading out a program stored in the ROM by the CPU. The controller 4 may also be formed of a plurality of microcomputers.

The controller 4 controls the supply of the power from the constant-current source 2. The electric signal from the voltage sensor 3 is input to the controller 4. The controller 4 computes the state information indicating the internal state of the power storage device 10 on the basis of the voltage change in the power storage device 10 that is specified by the electric signal. For example, the state information of the power storage device 10 includes a result of a pass/fail determination of the power storage device 10, the self-discharging state of the power storage device 10, an electrostatic capacitance Cst of the power storage unit 13, or the like. An indicator indicating the self-discharging state of the power storage device 10 includes the self-discharge current Ipr, the discharge resistance Rpr, and so forth.

In this embodiment, the controller 4 detects the voltage change in the power storage device 10 on the basis of the voltage of the power storage device 10 subjected to the measurement. When the voltage change in the power storage device 10 falls within a normal range, the controller 4 then determines that the power storage device 10 is normal, and when the voltage change in the power storage device 10 does not fall within the normal range, the controller 4 determines that the power storage device 10 is abnormal. As described above, the controller 4 determines whether the power storage device 10 is being passed or failed.

The display unit 5 notifies a user of information such as inspection results from the controller 4 by displaying them. The display unit 5 is, for example, a touch screen and is formed such that the user can visually check the information and such that the user can perform operation.

Next, an inspection method of the power storage device 10 for performing an inspection of the self discharge in the power storage device 10 by using the inspection apparatus 1 will be described with reference to FIGS. 2 and 3. FIG. 2 is a flowchart showing an example of processing procedure of the inspection method using the inspection apparatus 1. FIG. 3 is a diagram showing an example of the voltage change against a charging time for the power storage device 10.

The inspection apparatus 1 executes the inspection in an environment in which a temperature change of the power storage device 10 is suppressed by, for example, storing the power storage device 10 in a constant temperature oven capable of maintaining a constant ambient temperature.

In step S1, the inspection of the power storage device 10 is started by connecting the inspection apparatus 1 to the power storage device 10 and by supplying the constant current from the constant-current source 2 to start the charging. This step S1 is executed as a supply step in which the constant current is supplied to the power storage device 10.

In step S2, the controller 4 causes the voltage sensor 3 to measure the voltage (the initial voltage) of the power storage device 10. The electric signal corresponding to the voltage value of the power storage device 10 detected by the voltage sensor 3 is input to the controller 4.

In step S3, the controller 4 determines whether or not the charging time that is an elapsed time since the start of the charging has exceeded a predetermined time period. The predetermined time period is set in advance to such a duration that the difference becomes apparent in the voltage change between the case in which the power storage device 10 is normal and the case in which the power storage device 10 is abnormal. When it is determined that the charging time has exceeded the predetermined time period in step S3, the process proceeds to step S4. On the other hand, when it is determined that the charging time has not exceeded the predetermined time period in step S3, the process returns to step S2, and the voltage of the power storage device 10 is measured again. These steps S2 and S3 are executed as a measurement step in which the voltage of the power storage device 10 is measured.

As described above, by executing steps S2 and S3, the voltage sensor 3 measures an initial voltage of the constant current at the start of supply (at the start of charging) and a charging voltage in a state in which the constant current is supplied from the constant-current source 2. In other words, the voltage sensor 3 measures the voltage of the power storage device 10 at least twice including once in a state in which the constant current is supplied from the constant-current source 2.

In step S4, the controller 4 detects the voltage change in the power storage device 10 on the basis of the voltage of the power storage device 10 measured by the voltage sensor 3. Specifically, the controller 4 obtains the approximate straight line for the voltage change in the power storage device 10 on the basis of the initial voltage at the start of charging and the charging voltage in a state in which the constant current is supplied from the constant-current source 2. More specifically, the controller 4 obtains the approximate straight line for the voltage change using, for example, a least squares analysis on the basis of the voltage values of the power storage device 10 measured at every control period.

Instead, the controller 4 may detect the voltage change from the difference between the initial voltage at the start of charging and the charging voltage in a state in which the constant current is supplied from the constant-current source. In this case, because it suffices to measure the voltage of the power storage device 10 twice by the voltage sensor 3, the voltage measurement may also be performed after being switched by a multiplexer, for example. Thus, it is possible to simplify the inspection apparatus 1.

In step S5, it is determined whether or not the gradient of the approximate straight line falls within a predetermined range. When it is determined that the gradient of the approximate straight line falls within the predetermined range between the upper limit value and the lower limit value in step S5, because the power storage device 10 is in a normal state, the process proceeds to step S6. On the other hand, when it is determined that the gradient of the approximate straight line does not fall within the predetermined range, in other words, the gradient is larger than the upper limit value of the predetermined range or smaller than the lower limit value of the predetermined range in step S5, because the power storage device 10 is in an abnormal state, the process proceeds to step S7.

In step S6, the controller 4 notifies the user that the power storage device 10 is in the normal state by displaying it on the display unit 5. On the other hand, in step S7, the controller 4 notifies the user that the power storage device 10 is in the abnormal state by displaying it on the display unit 5.

As described above, by executing steps S4 to S6, the controller 4 detects the voltage change in the power storage device 10 on the basis of the voltage of the power storage device 10 subjected to the measurement and determines that the power storage device 10 is normal when the voltage change falls within the normal range. In other words, steps S4 to S6 are executed by the controller 4 as a control step in which the internal state of the power storage device 10 is computed on the basis of the voltage change in the power storage device 10 subjected to the measurement.

By executing the above-described processing, the pass/fail determination of the power storage device 10 is completed.

Next, the processing of steps S4 and S5 will be described with reference to a specific example shown in FIG. 3. The horizontal axis in FIG. 3 indicates the charging time [s] that is the elapsed time since the start of the charging of the power storage device 10, and the vertical axis indicates the difference [μV] between the voltage detected by the voltage sensor 3 and the initial voltage.

Figure 3:
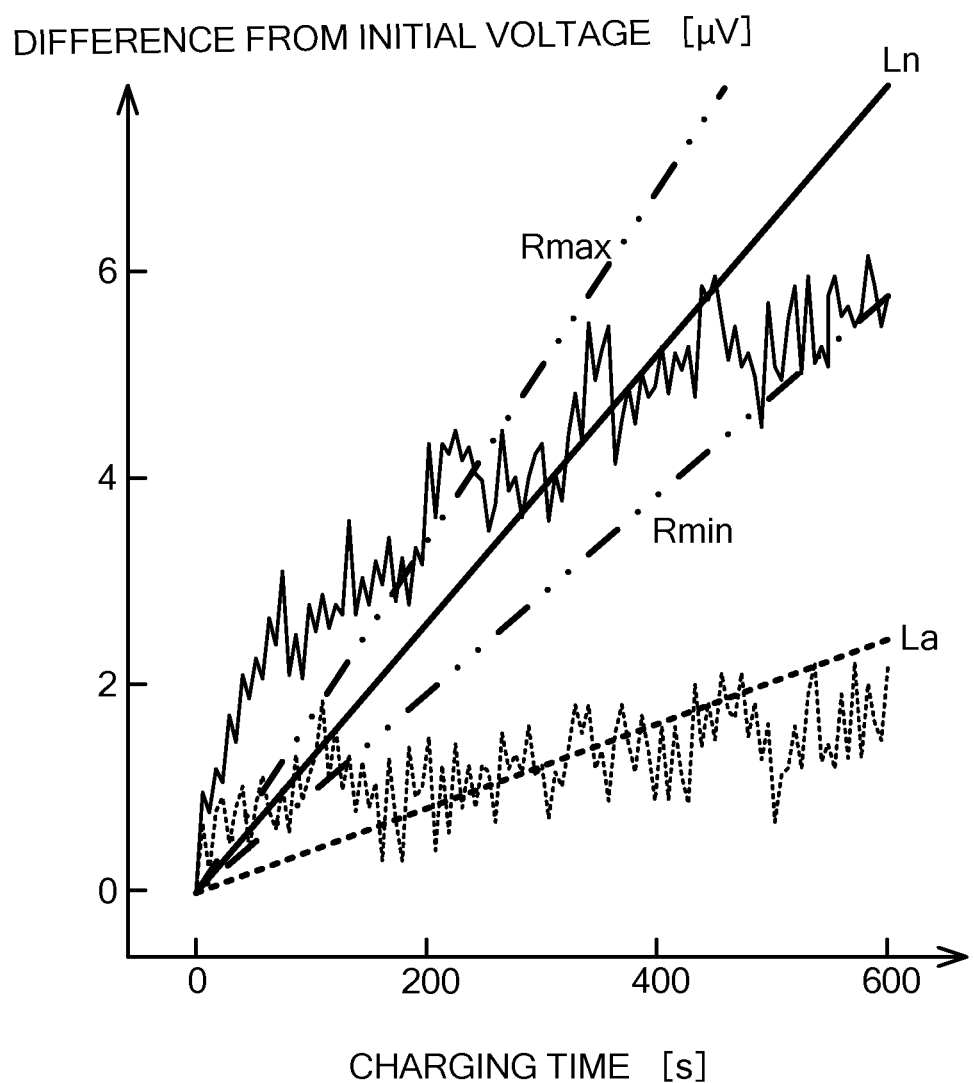
FIG. 3 is a diagram showing an example of a voltage change against a charging time for the power storage device.

The data shown by a solid line in FIG. 3 indicates the voltage change when the power storage device 10 is in the normal state, and a solid straight line indicates an approximate straight line Ln for the voltage change obtained in the processing in step S4. On the other hand, the data shown by a dotted line in FIG. 3 indicates the voltage change when the power storage device 10 is in the abnormal state, and a broken straight line indicates an approximate straight line La for the voltage change obtained in the processing in step S4. In addition, the gradient of the approximate straight line Ln is referred to as Rn, and the gradient of the approximate straight line La is referred to as Ra.

In addition, two two-dot chain straight lines shown in FIG. 3 respectively indicate an upper limit value Rmax and a lower limit value Rmin of the gradient of the approximate straight line, and the gradient for the power storage device 10 in the normal state lies between the two-dot chain straight lines. The upper limit value Rmax and the lower limit value Rmin of the gradient of the approximate straight line are set at ±10%, for example, of the approximate straight line that is measured and obtained in advance by using the power storage device 10 in the normal state.

Referring to FIG. 3, the approximate straight line Ln (the gradient Rn) for the voltage change in the power storage device 10 shown by the solid line lies between the upper limit value Rmax and the lower limit value Rmin of the gradient of the approximate straight line. Thus, the controller 4 determines that the power storage device 10 is in the normal state. On the other hand, the approximate straight line La (the gradient Ra) for the voltage change in the power storage device 10 shown by the dotted line does not lie between the upper limit value Rmax and the lower limit value Rmin of the gradient of the approximate straight line. Thus, the controller 4 determines that the power storage device 10 is in the abnormal state.

As described above, the controller 4 determines whether the power storage device 10 is in the normal state or in the abnormal state on the basis of whether or not the gradient of the approximate straight line lies between the upper limit value Rmax and the lower limit value Rmin. In other words, the controller 4 detects the voltage change in the power storage device 10 on the basis of the voltage of the power storage device 10 subjected to the measurement, and when the voltage change falls within the normal range, the controller 4 determines that the power storage device 10 is normal.

In the example shown in FIG. 3, although it take a period of 600 [s] to perform the pass/fail determination of the power storage device 10, the difference between the gradient of the approximate straight line Ln for the voltage change in the power storage device 10 shown by the solid line and the gradient of the approximate straight line La for the voltage change in the power storage device 10 shown by the broken line can clearly be checked after about 200 [s] has elapsed. As described above, the inspection apparatus 1 can execute the pass/fail determination of the power storage device 10 within a short time of about a few minutes.

As described above, when the power storage device 10 is charged by the constant current supplied from the constant-current source 2 and when the voltage change in the power storage device 10, which is detected by measuring the voltage at least twice including once in the state in which the constant current is supplied, falls within the normal range, the power storage device 10 is determined as being normal. Thus, because there is no need to wait until the voltage of the power storage device 10 is lowered by the self discharge, a time required to perform the pass/fail determination of the power storage device 10 is short. Therefore, it is possible to perform the pass/fail determination of the power storage device 10 within a short time.

At this time, the constant-current source 2 supplies the constant current at a level that is lower than the overpotential and at which the electrical double layer reaction is mainly caused in the power storage device 10 and charges the power storage device 10. Thus, because the level of the constant current is low, the percentage of the current Ist [A] flowing through the power storage unit 13 with respect to the current Ipr [A] flowing through the parallel resistance 15 is large. Thus, the difference in the gradient of the charge curve between the presence/absence of the parallel resistance 15 is increased, and so, it is easy to detect whether or not the power storage device 10 is normal.

Next, operational advantages according to the first embodiment will be described.

The inspection apparatus 1 serving as the measurement apparatus for the power storage device 10 is provided with the constant-current source 2 that supplies the constant current the power storage device 10, the voltage sensor 3 that measures the voltage of the power storage device 10, and the controller 4 that computes the information indicating the internal state of the power storage device 10 on the basis of the voltage change in the power storage device 10 subjected to the measurement.

Furthermore, the measurement method of the power storage device 10 includes: the supply step (S1) in which the constant current is supplied to the power storage device 10; the measurement step (S2, S3) in which the voltage of the power storage device 10 is measured; and the control step (S4 to S6) in which the internal state of the power storage device 10 is computed on the basis of the voltage change in the power storage device 10 subjected to the measurement.

The differences in the internal state of the individual power storage device 10 tend to appear as the difference in the time change of the voltage of the power storage device 10. Thus, according to the configuration described above, because the constant current is supplied to the power storage device 10, compared with a state in which the constant current is not supplied to the power storage device 10, it is possible to enhance the voltage change in the power storage device 10. Thus, the controller 4 can readily detect the voltage change in the power storage device 10, and so, it is possible to estimate the state of the power storage device within a short time.

In addition, the inspection apparatus 1 for the power storage device 10 that performs the inspection of the self discharge in the power storage device 10 is provided with: the constant-current source 2 that supplies the constant current the power storage device 10; and the voltage sensor 3 that measures the voltage of the power storage device 10 at least twice including once in a state in which the constant current is supplied from the constant-current source 2. Furthermore, the power storage device 10 is provided with the controller 4 that detects the voltage change in the power storage device 10 on the basis of the voltage of the power storage device 10 subjected to the measurement and that determines that the power storage device 10 is normal when the voltage change falls within the normal range.

Furthermore, in the inspection method of the power storage device 10 that performs the inspection of the self discharge in the power storage device 10, the constant current is supplied to the power storage device 10 and the voltage of the power storage device 10 is measured at least twice including once in a state in which the constant current is supplied from the constant-current source 2. In the inspection method, the voltage change in the power storage device 10 is detected on the basis of the voltage of the power storage device 10 subjected to the measurement, and when the voltage change falls within the normal range, the power storage device 10 is determined as being normal.

In contrast to these configurations, in the general inspection method described in JP2015-072148A, in order to perform the pass/fail determination of the secondary battery, it is required to store the secondary battery for a period of several days to several weeks as the aging time until the voltage is lowered due to the self discharge.

Therefore, with the above described configurations of the inspection apparatus 1 and the inspection method according to this embodiment, when the constant current is supplied from the constant-current source 2 to the power storage device 10 and when the voltage change in the power storage device 10, which is detected by measuring the voltage at least twice including once in the state in which the constant current is supplied, falls within the normal range, the power storage device 10 is determined as being normal. Thus, because there is no need to wait until the voltage of the power storage device 10 is lowered by the self discharge, a time required to perform the pass/fail determination of the power storage device 10 is short. Therefore, it is possible to perform the pass/fail determination of the power storage device 10 within a short time.

In addition, compared with a case in which a relatively low constant voltage is supplied to the power storage device 10, it is easier to supply a relatively low current by using the constant-current source 2. Thus, in the inspection apparatus 1, by using the constant-current source 2, it is possible to stably supply the constant current at a level that is lower than the overpotential and at which the electrical double layer reaction is mainly caused in the power storage device 10.

In addition, the constant-current source 2 supplies the constant current at a level that is lower than the overpotential and at which the electrical double layer reaction is mainly caused in the power storage device 10 and charges the power storage device 10.

According to this configuration, because the level of the constant current is low, the percentage of the current Ist [A] flowing through the power storage unit 13 with respect to the current Iir [A] flowing through the internal resistance 14 is increased. Thus, the difference in the gradient of the charge curve between the presence/absence of the parallel resistance 15 is increased, and so, it is easy to detect whether or not the power storage device 10 is normal.

In addition, the voltage sensor 3 measures the initial voltage of the constant current at the start of supply and the charging voltage in a state in which the constant current is supplied from the constant-current source 2, and the controller 4 detects the voltage change in the power storage device 10 on the basis of the initial voltage and the charging voltage.

According to this configuration, the controller 4 detects the voltage change from the difference between the initial voltage of the constant current at the start of supply and the charging voltage in a state in which the constant current is supplied from the constant-current source 2. In this case, because it suffices to measure the voltage of the power storage device 10 twice by the voltage sensor 3, the voltage measurement may also be performed after being switched by a multiplexer, for example. Thus, it is possible to simplify the inspection apparatus 1.

In the above-mentioned embodiment, although the voltage sensor 3 measures the voltage of the power storage device 10 as the initial voltage after the charging of the power storage device 10 has been started, instead of this, the voltage sensor 3 may measure the voltage of the power storage device 10 as the initial voltage before the charging of the power storage device 10 is started. Also in this case, it is possible to measure the voltage of the power storage device 10 at least twice including once in a state in which the constant current is supplied, and therefore, it is possible to obtain the approximate straight line for the voltage change.

Second Embodiment

Figure 4:
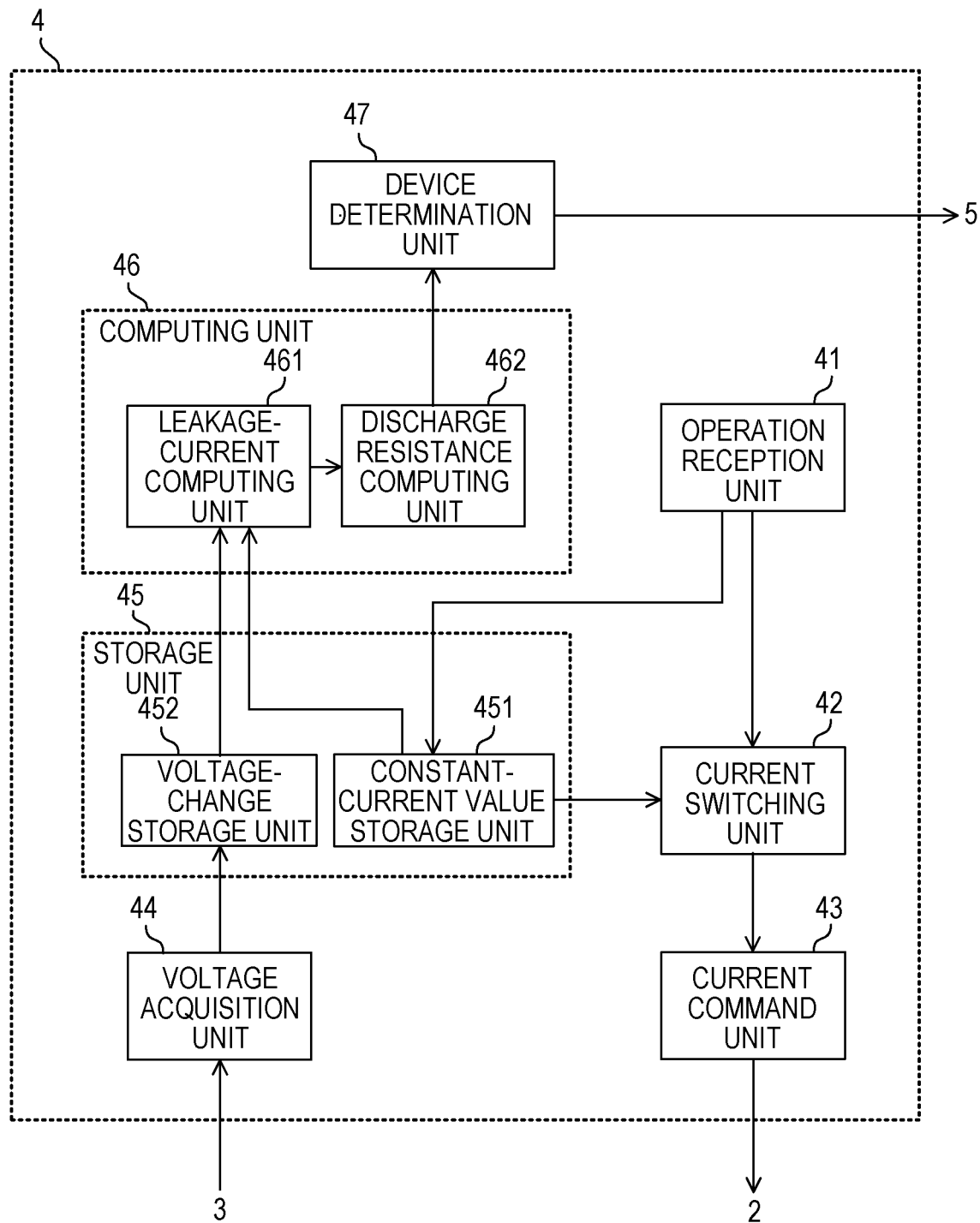
FIG. 4 is a block diagram showing a functional configuration of a controller according to a second embodiment.

Next, the inspection apparatus 1 according to a second embodiment will be described. FIG. 4 is a functional block diagram showing a functional configuration of the controller 4 according to the second embodiment.

The controller 4 in this embodiment executes the processing of inspecting the power storage device 10 by using: the constant-current source 2 that successively supplies the constant currents having current values different from each other to the power storage device 10; and the voltage sensor 3 that measures the voltage of the power storage device 10 for every constant current supplied to the power storage device 10.

Specifically, the controller 4 computes the discharge resistance Rpr through which the self-discharge current Ipr flows or the self-discharge current Ipr of the power storage device 10 on the basis of the voltage change in the power storage device 10 measured by the voltage sensor 3 for every constant current.

As described above, the inspection apparatus 1 including the controller 4 in this embodiment forms the measurement apparatus that measures the self-discharge current Ipr or the discharge resistance Rpr of the power storage device 10 as the internal state of the power storage device 10. In the following, at least one of the self-discharge current Ipr and the discharge resistance Rpr is also referred to as "a self-discharge related parameter".

The controller 4 is provided with an operation reception unit 41, a current switching unit 42, a current command unit 43, a voltage acquisition unit 44, a storage unit 45, a computing unit 46, and a device determination unit 47. The storage unit 45 is provided with a constant-current value storage unit 451 that stores at least two current values and a voltage-change storage unit 452 that stores the voltage change in the power storage device 10 measured by the voltage sensor 3.

The operation reception unit 41 receives operation information generated by an input operation performed by the user to an input device such as a keyboard, a mouse, and so forth. As the operation reception unit 41 receives the operation information for instructing execution of an inspection processing of the power storage device 10, the operation reception unit 41 outputs a control signal to the current switching unit 42 for supplying the constant current to the power storage device 10.

The current switching unit 42 forms switching means that switches the constant current to be supplied to the power storage device 10. As the current switching unit 42 in this embodiment receives the above-described control signal from the operation reception unit 41, the current switching unit 42 acquires a first current value from the constant-current value storage unit 451 for detecting the self-discharge current Ipr of the power storage device 10 and outputs thus acquired first current value to the current command unit 43.

When the constant current is supplied to the power storage device 10 to charge the power storage device 10, similarly to the first embodiment, the above-described first current value is set to a level that is lower than the overpotential and at which the electrical double layer reaction is mainly caused in the power storage device 10. Specifically, the first current value is set to one or several times the reference value of the self-discharge current Ipr of the power storage device 10. For example, the first current value is set to 10 [μA] that is one times the reference value of the self-discharge current Ipr.

The reference value of the self-discharge current Ipr is known information, and is, for example, set in advance by using the statistical data obtained by aggregating the self-discharge current Ipr of the numerous power storage devices 10, test results for the self-discharge current Ipr of the specific power storage device 10 whose electrical property is normal, or the like.

The current switching unit 42 outputs the first current value to the current command unit 43, and thereafter, the current switching unit 42 determines whether or not a predetermined switching condition is satisfied for switching the constant current to be supplied from the constant-current source 2 to the power storage device 10.

For example, as in the first embodiment, the current switching unit 42 determines that the switching condition is satisfied when the charging time, which is the elapsed time since the constant current indicating the first current value is supplied from the constant-current source 2 to the power storage device 10, exceeded the predetermined time period. Alternatively, the current switching unit 42 may determines that the switching condition is satisfied when the control signal for switching the constant current is received from the operation reception unit 41 by the input operation by the user.

When the current switching unit 42 determines that a predetermined switching condition is satisfied, the current switching unit 42 acquires a second current value that is larger than the first current value from the constant-current value storage unit 451 and outputs the acquired second current value to the current command unit 43. As described above, the current switching unit 42 switches the constant current to be supplied to the power storage device 10 between the constant current indicating the first current value and the constant current indicating the second current value. In the following, the constant current indicating the first current value is also simply referred to as "the first constant current" and the constant current indicating the second current value is also simply referred to as "the second constant current".

The above-described second current value is set to at least ten times the reference value of the self-discharge current Ipr of the power storage device 10. For example, the second current value is set to fifty times the reference value of the self-discharge current Ipr. The second current value is acquired by the current switching unit 42 and is output to the current command unit 43.

After acquiring the first or the second current value from the current switching unit 42, the current command unit 43 sends a command signal for instructing the supply of the constant current indicating thus acquired current value to the constant-current source 2. By doing so, the constant-current source 2 supplies the constant current indicating the current value instructed by the command signal to the power storage device 10.

In this embodiment, the constant-current source 2 switches the constant current to be supplied to the power storage device 10 to the second current value from the first current value after maintaining the first current value for the predetermined time period. In other words, the constant-current source 2 supplies the first constant current to the power storage device 10 only for the predetermined time period, and thereafter, supplies the second constant current to the power storage device 10 only for a specific time. The period of the specific time may be shorter than or equal to the predetermined time period.

The voltage acquisition unit 44 acquires a detection signal of the voltage sensor 3 measuring the voltage of the power storage device 10 for every constant current that is switched by the current switching unit 42. The voltage acquisition unit 44 receives the electric signal corresponding to the voltage value of the power storage device 10 from the voltage sensor 3 over a period from the start of the supply of the first constant current to the end of the supply of the second constant current, for example. The voltage acquisition unit 44 records the received electric signals in the voltage-change storage unit 452 in a time series.

At least the above-described first and the second current values are stored in the constant-current value storage unit 451. For example, the first and second current values may be stored in the constant-current value storage unit 451 in advance, or alternatively, the first and second current values may be recorded in the constant-current value storage unit 451 by the operation reception unit 41 in response to the input operation performed by the user.

In the voltage-change storage unit 452, the voltage changes measured for every constant current supplied to the power storage device 10 are recorded by the voltage acquisition unit 44. The data indicating the voltage change in the power storage device 10 recorded in the voltage-change storage unit 452 is processed by the computing unit 46.

The computing unit 46 forms control means that computes the self-discharge current Ipr and the discharge resistance Rpr of the power storage device 10 on the basis of the voltage change in the power storage device 10 measured by the voltage sensor 3 for every constant current with different current values. The computing unit 46 in this embodiment is provided with a leakage-current computing unit 461 and a discharge resistance computing unit 462.

The leakage-current computing unit 461 obtains the gradient for the voltage change in the power storage device 10 for every constant current supplied to the power storage device 10. The leakage-current computing unit 461 forms current computing means that computes the self-discharge current Ipr of the power storage device 10 by using respective gradients of the voltage changes in the power storage device 10 thus obtained and respective current values of the first and the second constant currents.

The leakage-current computing unit 461 refers to the voltage-change storage unit 452 and detects the voltage change in the power storage device 10 for every constant current supplied to the power storage device 10. Specifically, as shown in FIG. 3, the leakage-current computing unit 461 obtains the gradient for the voltage change in the power storage device 10 on the basis of the initial voltage of the constant current at the start of supply and the charging voltage in a state in which the constant current is supplied from the constant-current source 2.

Instead, the leakage-current computing unit 461 may refer to the voltage-change storage unit 452, obtain the approximate straight line Ln for the voltage change in the power storage device 10 for every constant current supplied to the power storage device 10, and use the gradient of the approximate straight line Ln as the gradient for the voltage change.

The leakage-current computing unit 461 computes the self-discharge current Ipr of the power storage device 10 by using a numerical equation for obtaining the electrostatic capacitance Cst of the power storage unit 13 that is a capacity component of the power storage device 10. In the following, a method of computing the self-discharge current Ipr of the power storage device 10 will be described.

The numerical equation for obtaining the electrostatic capacitance Cst of the power storage unit 13 can be expressed by using a gradient A1 for the voltage change in the power storage device 10 when the power storage device 10 is charged with the first constant current and the current Ist [A] charged to the power storage unit 13. The current Ist [A] charged to the power storage unit 13 is charged amount accumulated in the electrostatic capacitance Cst per unit time, and the current Ist [A] corresponds to a value (I1−Ipr) obtained by subtracting the self-discharge current Ipr flowing through the parallel resistance 15 from a current value I1 of the first constant current supplied to the power storage device 10.

Therefore, the numerical equation for obtaining the electrostatic capacitance Cst of the power storage unit 13 can be expressed as in the following equation (1) by using the self-discharge current Ipr of the power storage device 10, a first current value I1, and the gradient A1 for the voltage change when the power storage device 10 is charged with the first constant current.

[Numerical Equation 1]

$$C_{st} = \frac{I_1 - I_{pr}}{A_1} \tag{1}$$

Similarly, the numerical equation for obtaining the electrostatic capacitance Cst of the power storage unit 13 can be expressed as in the following equation (2) by using a second current value I2 and a gradient A2 for the voltage change when the power storage device 10 is charged with the constant current indicating the second current value I2.

[Numerical Equation 2]

$$C_{st} = \frac{I_2}{A_2} \tag{2}$$

In the equation (2), the current Ist [A] charged to the power storage unit 13 corresponds to a value (I2−Ipr) obtained by subtracting the self-discharge current Ipr from the current value I2 of the second constant current. However, as described above, because the current value I2 of the second constant current that is the current flowing through the internal resistance 14 shown in FIG. 1 is sufficiently larger than the self-discharge current Ipr flowing through the parallel resistance 15, it can be approximated as in the following equation (3).

[Numerical Equation 3]

$$I_2 \approx (I_2 - I_{pr}) \quad (3)$$

Therefore, in the above-described equation (2), the current value I2 of the second constant current is used instead of the current value (I2−Ipr) obtained by subtracting the self-discharge current Ipr from the current value I2 of the second constant current.

Next, by solving the above-described equation (1) and equation (2) for the self-discharge current Ipr, the following equation (4) is derived.

[Numerical Equation 4]

$$I_{pr} = I_1 - \frac{A_1}{A_2} I_2 \quad (4)$$

As described above, by substituting the gradients A1 and A2 of the voltage change detected for every constant current and the current values I1 and I2 of the constant currents into the numerical equation for obtaining the electrostatic capacitance Cst of the power storage unit 13, it is possible to calculate the self-discharge current Ipr of the power storage device 10.

Thus, the leakage-current computing unit 461 obtains the gradient A1 for the voltage change associated with the first constant current and the gradient A2 for the voltage change associated with the second constant current and acquires the current value I1 of the first constant current and the current value I2 of the second constant current from the constant-current value storage unit 451.

The leakage-current computing unit 461 then calculates the self-discharge current Ipr by substituting these parameters into the above-described equation (4). The leakage-current computing unit 461 outputs the self-discharge current Ipr of the power storage device 10 thus calculated to the discharge resistance computing unit 462.

The discharge resistance computing unit 462 forms resistance computing means that computes the discharge resistance Rpr of the power storage device 10 on the basis of the self-discharge current Ipr output from the leakage-current computing unit 461. In this embodiment, the discharge resistance computing unit 462 calculates the discharge resistance Rpr of the power storage device 10 by dividing an open circuit voltage (OCV) of the power storage device 10 by the self-discharge current Ipr of the power storage device 10.

For the open circuit voltage (OCV) of the power storage device 10, the voltage value of the power storage device 10 measured by the voltage sensor 3 before the supply of the constant current has been started may be used, or alternatively, for the open circuit voltage (OCV), a voltage value that is set in advance by using test results of the power storage device 10, etc. may be used.

Instead of using the above-described calculation method, an association table or a function expressing a relationship between the self-discharge current Ipr of the power storage device 10 and the discharge resistance Rpr may be stored in the storage unit 45 in advance, and the discharge resistance computing unit 462 may calculate the discharge resistance Rpr by using the association table or the function.

The discharge resistance computing unit 462 outputs the discharge resistance Rpr of the power storage device 10 thus calculated to the device determination unit 47.

The device determination unit 47 forms determination means that determines that the power storage device 10 is normal on the basis of the self-discharge current Ipr or the discharge resistance Rpr computed by the computing unit 46.

In this embodiment, the device determination unit 47 determines whether or not the power storage device 10 is normal on the basis of the discharge resistance Rpr of the power storage device 10 output from the discharge resistance computing unit 462. For example, the device determination unit 47 determines whether or not a calculated value of the discharge resistance Rpr of the power storage device 10 falls within a predetermined resistance range. The upper limit value and the lower limit value of the predetermined resistance range are set in advance by using the statistical data obtained by aggregating the discharge resistance Rpr of the numerous power storage devices 10, the test results for the specific power storage device 10 whose electrical property is normal, or the like. The resistance range is, for example, stored in the storage unit 45.

When the device determination unit 47 determines that the calculated value of the discharge resistance Rpr falls within the predetermined resistance range, the device determination unit 47 determines that the power storage device 10 is in the normal state, and when the device determination unit 47 determines that the calculated value of the discharge resistance Rpr does not fall within a predetermined range, the device determination unit 47 determines that the power storage device 10 is abnormal.

In addition, the device determination unit 47 may acquire the self-discharge current Ipr of the power storage device 10 instead of the discharge resistance Rpr of the power storage device 10 and may determine whether or not the power storage device 10 is in the normal state on the basis of the self-discharge current Ipr of the power storage device 10.

In this case, the device determination unit 47 determines whether or not the calculated value of the self-discharge current Ipr falls within a predetermined current range, and when the device determination unit 47 determines that the calculated value of the self-discharge current Ipr falls within the predetermined current range, the device determination unit 47 determines that the power storage device 10 is in the normal state. Similarly to the above-described resistance range, the predetermined current range is set in advance by using the statistical data of the self-discharge current Ipr, test results, or the like and is stored in the storage unit 45, for example.

The device determination unit 47 outputs a determination result indicating the normal state or the abnormal state of the power storage device 10 to the display unit 5. By doing so, the determination result for the power storage device 10 provided by the device determination unit 47 is displayed on a screen of the display unit 5.

In the above-mentioned embodiment, although the current switching unit 42 switches the constant current to be supplied to the power storage device 10 from the first current value I1 to the second current value I2, the present invention is not limited thereto. For example, the current switching unit 42 may cause the constant current indicating the second current value I2 to be supplied to the power storage device 10 first, and thereafter, the constant current to be supplied to the power storage device 10 may be switched from that indicating the second current value I2 to that indicating the first current value I1. Also in this case, the controller 4 can calculate the self-discharge current Ipr and the discharge resistance Rpr of the power storage device 10.

In addition, in the above-mentioned embodiment, although the current switching unit 42 controls the operation of the constant-current source 2 such that a plurality of constant currents with different current values are successively supplied to the power storage device 10, as long as the electrostatic capacitance Cst of the power storage unit 13 is known, only the constant current indicating the first current value I1 may be supplied.

In this case, the electrostatic capacitance Cst of the power storage unit 13 is stored in the storage unit 45 in advance, and the leakage-current computing unit 461 acquires the electrostatic capacitance Cst of the power storage unit 13 from the storage unit 45 and acquires the first current value I1 and the gradient A1 for the voltage change associated with the first current value I1. The current computing unit 461 then calculates the self-discharge current Ipr of the power storage device 10 by substituting these parameters into the above-described equation (1).

The electrostatic capacitance Cst of the power storage unit 13 to be stored in the storage unit 45 is set in advance by using the statistical data obtained by aggregating the electrostatic capacitance Cst of the power storage unit 13 of the numerous power storage device 10, the test results for the specific power storage device 10 whose electrical property is normal, or the like. For the electrostatic capacitance Cst of the power storage unit 13, the electrostatic capacitance Cst of the power storage unit 13 may be obtained by charging the power storage device 10 with the constant current indicating the second current value I2 and by substituting the gradient A2 for the voltage change at this time and the second current value I2 into the above-described equation (2).

Figure 5:
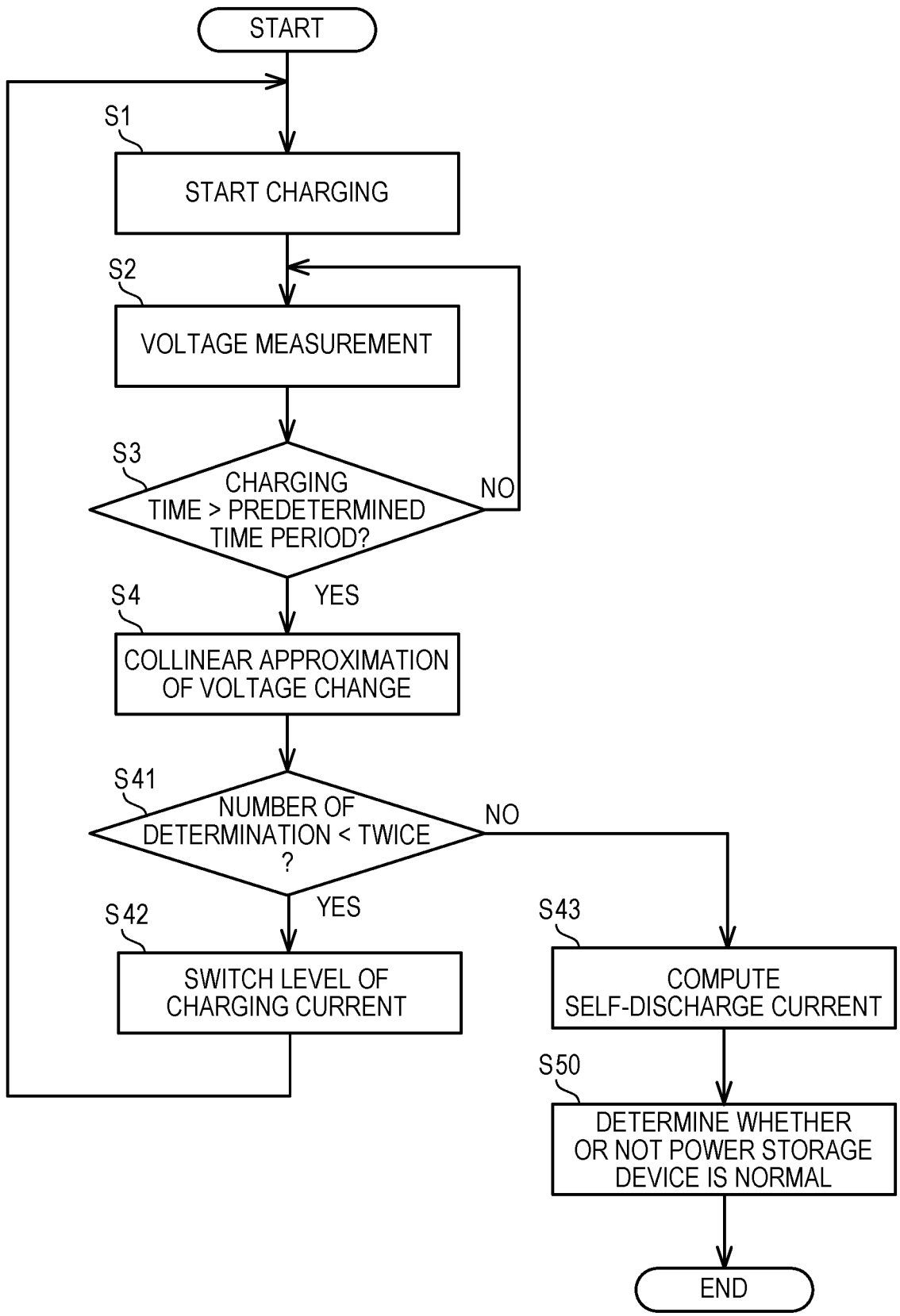
FIG. 5 is a flowchart of the inspection method according to the second embodiment.
Figure 6:
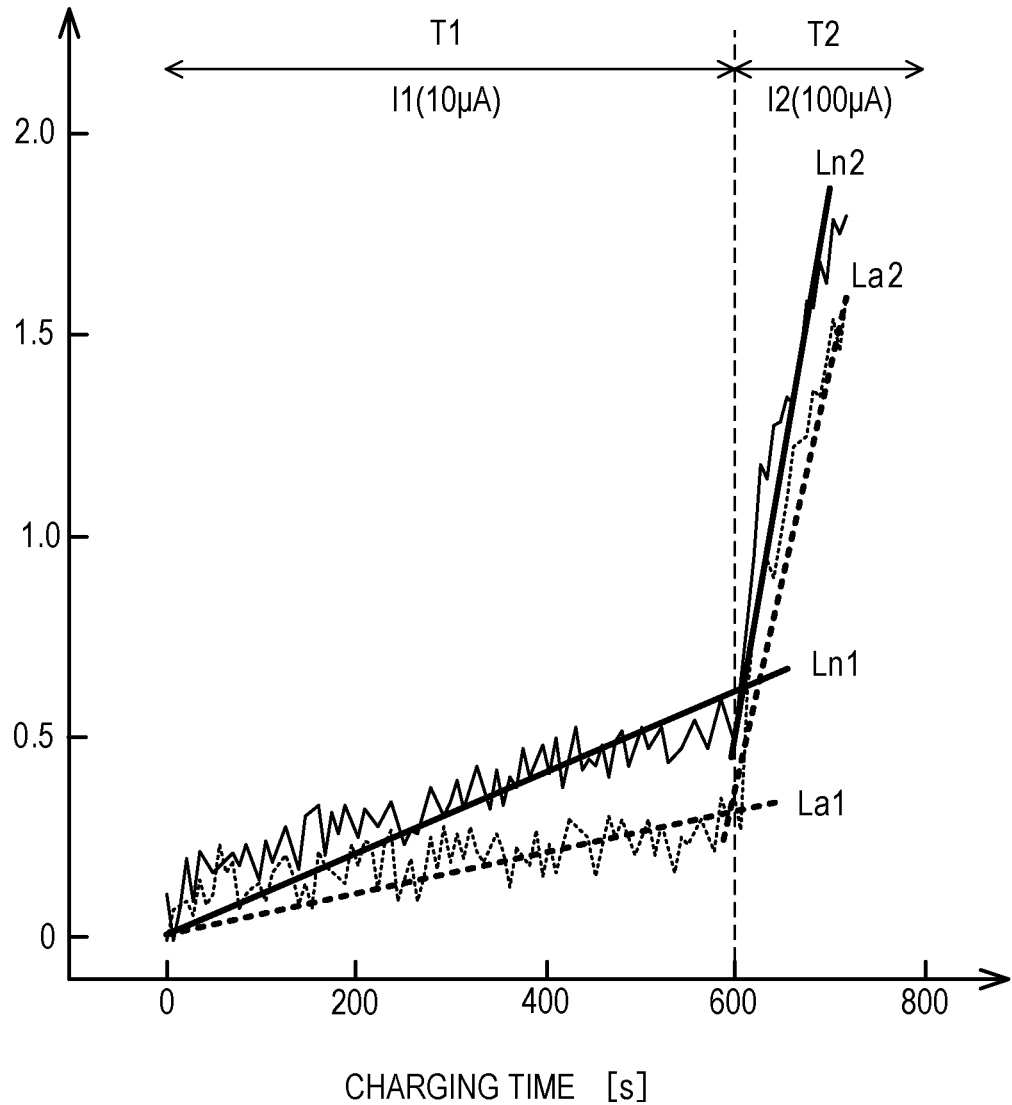
FIG. 6 is a diagram showing an example of the voltage change against the charging time in a state in which a level of constant current to be charged to the power storage device is switched.

Next, the inspection method of the power storage device 10 including the measurement method of the self-discharge related parameters of the power storage device 10 using the inspection apparatus 1 according to this embodiment will be described with reference to FIGS. 5 and 6. FIG. 5 is a flowchart showing an example of the processing procedure of the inspection method using the inspection apparatus 1. FIG. 6 is a diagram showing an example of the voltage change against the charging time in the power storage device 10.

Figure 2:
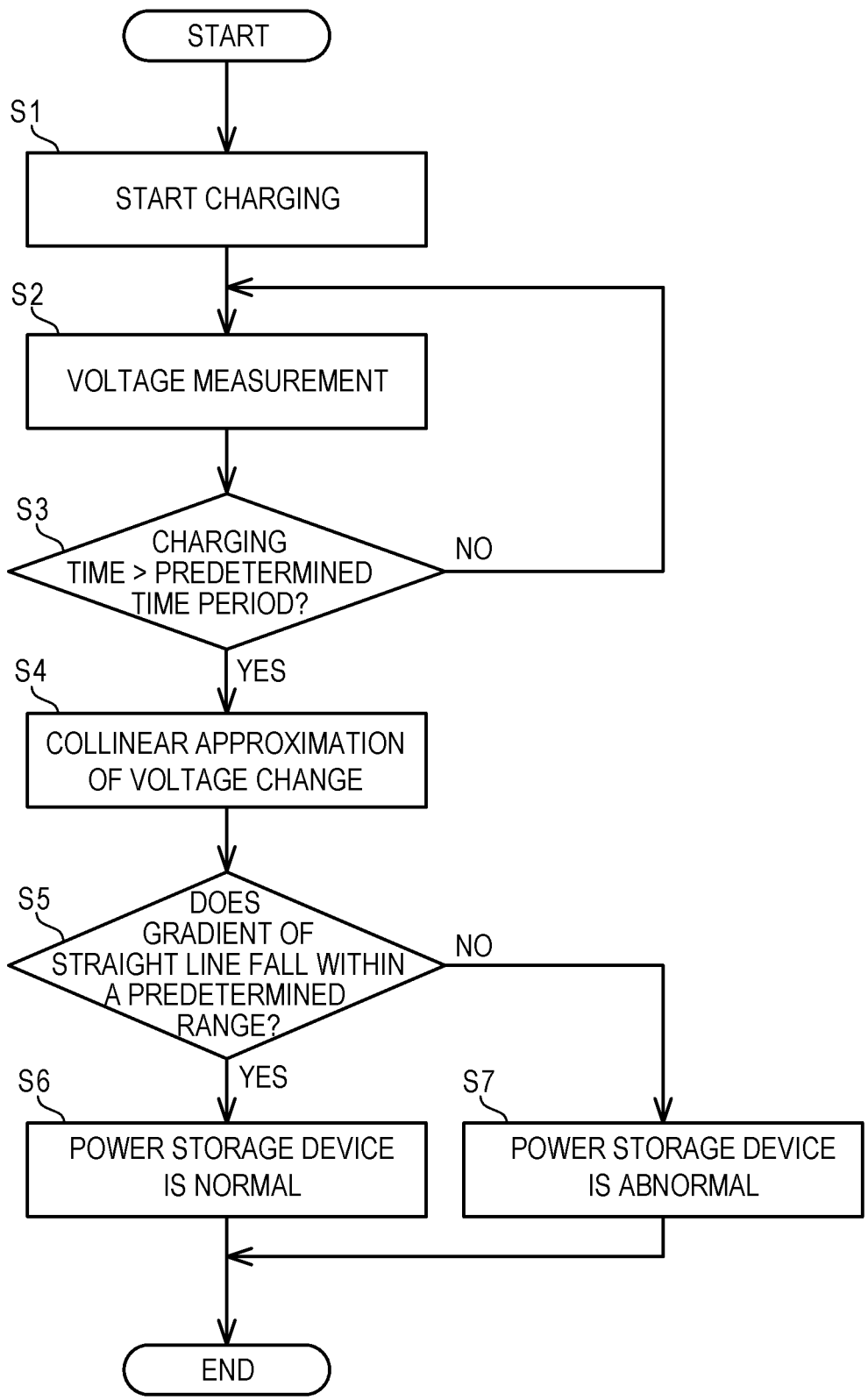
FIG. 2 is a flowchart of an inspection method using the inspection apparatus for the power storage device.

The inspection method according to this embodiment includes processing of steps S41 to S43 and processing of step S50 instead of the processing of steps S5 to S7 in the processing procedure of the inspection method shown in FIG. 2. In the following, the processing of steps S41 to S43 and the processing of step S50 will be described in detail.

In step S1, the inspection of the power storage device 10 is started by starting the charging by connecting the inspection apparatus 1 to the power storage device 10, and by supplying the constant current from the constant-current source 2 to the first current value I1.

In step S2, the controller 4 causes the voltage sensor 3 to measure the voltage (the initial voltage) of the power storage device 10. The electric signal corresponding to the voltage value of the power storage device 10 detected by the voltage sensor 3 is input to the controller 4.

In step S3, the controller 4 determines whether or not the charging time that is the elapsed time since the start of the charging has exceeded a predetermined time period. The predetermined time period is set in advance to such a duration that the difference becomes apparent in the voltage change between the case in which the power storage device 10 is normal and the case in which the power storage device 10 is abnormal. When it is determined that the charging time has exceeded the predetermined time period in step S3, the process proceeds to step S4. On the other hand, when it is determined that the charging time has not exceeded the predetermined time period in step S3, the process returns to step S2, and the voltage of the power storage device 10 is measured again.

In step S4, the controller 4 detects the voltage change in the power storage device 10 on the basis of the voltage of the power storage device 10 measured by the voltage sensor 3. Specifically, the controller 4 obtains the approximate straight line for the voltage change in the power storage device 10 on the basis of the initial voltage at the start of charging and the charging voltage in a state in which the constant current is supplied from the constant-current source 2. More specifically, the controller 4 obtains the approximate straight line for the voltage change using, for example, the least squares analysis on the basis of the voltage values of the power storage device 10 measured at every control period.

In step S41, the controller 4 determines whether or not the number of determination that is the number of times the approximate straight line for the measured voltage change has been obtained is less than twice. When it is determined that the number of determination is less than twice in step S41, it is required to switch the constant current to be supplied to the power storage device 10, and so, the process proceeds to step S42.

In step S42, the controller 4 switches the level of the constant current to be supplied to the power storage device 10. In this embodiment, the controller 4 switches the constant current to be supplied to the power storage device 10 from the first constant current to the constant current indicating the second current value I2 larger than the first current value I1.

Thereafter, the process returns to step S1, and the controller 4 starts the charging by supplying the second constant current from the constant-current source 2. In step S2 and S3, the controller 4 measures the voltage of the power storage device 10 for the predetermined time period. In step S4, the controller 4 then obtains the approximate straight line for the voltage change associated with the second constant current.

When it is determined that the number of determination has reached twice in step S41, it now becomes possible to obtain the parameters required for the computation of the self-discharge current Ipr of the power storage device 10, and so, the process proceeds to step S43.

In step S43, the controller 4 computes the self-discharge current Ipr of the power storage device 10 on the basis of the gradient for the voltage change in the power storage device 10 obtained for every constant current. In this embodiment, the controller 4 calculates the self-discharge current Ipr of the power storage device 10 by using, as the above-mentioned parameters, the first current value I1, the gradient A1 of the approximate straight line associated with the first constant current, the second current value I2, and the gradient A2 of the approximate straight line associated with the second constant current. Specifically, the controller 4 calculates the self-discharge current Ipr of the power storage device 10 by substituting the above-mentioned parameters into the above-described equation (4).

As described above, steps S41 to S43 are executed by the controller 4 as the control steps for computing the self-discharge current Ipr of the power storage device 10 on the basis of the voltage change in the power storage device 10 subjected to the measurement.

In step S50, the controller 4 determines whether or not the power storage device 10 is normal on the basis of the self-discharge current Ipr of the power storage device 10.

For example, the controller 4 determines whether or not the discharge resistance Rpr of the power storage device 10 falls within the predetermined resistance range by obtaining the discharge resistance Rpr of the power storage device 10 by dividing the open circuit voltage (OCV) of the power storage device 10 by the self-discharge current Ipr of the power storage device 10. When it is determined that the discharge resistance Rpr falls within the predetermined resistance range between the upper limit value and the lower limit value, the controller 4 determines that the power storage device 10 is in the normal state. On the other hand, when it is determined that the discharge resistance Rpr does not falls within the predetermined resistance range, in other words, the discharge resistance Rpr is larger than the upper limit value of the resistance range, or the discharge resistance Rpr is smaller than the lower limit value of the resistance range, the controller 4 determines that the power storage device 10 is in the abnormal state.

Alternatively, the controller 4 may determine whether or not the power storage device 10 is in the normal state by determining whether or not the self-discharge current Ipr of the power storage device 10 falls within the predetermined current range. Alternatively, a diagnose table indicating the normal state or the abnormal state of the power storage device 10 for every current value of the self-discharge current Ipr may be stored in the controller 4 in advance. In this case, the controller 4 refers to the diagnose table after calculating the self-discharge current Ipr of the power storage device 10 and specifies the state of the power storage device 10 associated with the calculated self-discharge current Ipr.

By executing the above-described processing, the pass/fail determination of the power storage device 10 is completed.

In the example shown in FIG. 5, the controller 4 calculates the self-discharge current Ipr of the power storage device 10 by obtaining the gradient for the voltage change in the power storage device 10 twice by switching the level of the constant current to be supplied to the power storage device 10 only once. Instead, the controller 4 may calculate a plurality of self-discharge currents Ipr by successively obtaining the gradients of the approximate straight lines for the voltage change by switching the level of the constant current a plurality of times, and the controller 4 may then use statistical values, such as the average value, the median, or the like of the calculated values as the final result.

Next, the processing of step S43 will be described with reference to the specific example shown in FIG. 6. The horizontal axis in FIG. 6 indicates the charging time [s] that is the elapsed time since the start of the charging of the power storage device 10, and the vertical axis indicates the difference [μV] between the voltage detected by the voltage sensor 3 and the initial voltage.

The predetermined time period T1 is a time period during which the power storage device 10 is charged with the constant current indicating the first current value I1, and the predetermined time period T2 is a time period during which the power storage device 10 is charged with the constant current indicating the second current value I2 after the switching. The first current value I1 is 10 [μA], and the second current value I2 is 100 [μA].

The data shown by the solid line in FIG. 6 indicates the voltage change when the power storage device 10 is in the normal state, and the solid straight lines respectively indicate the approximate straight line Ln1 of the voltage change associated with the first constant current and the approximate straight line Ln2 of the voltage change associated with the second constant current. Both of the approximate straight line Ln1 and the approximate straight line Ln2 are straight lines obtained by the processing of step S4.

On the other hand, the data shown by the dotted line in FIG. 6 indicates the voltage change when the power storage device 10 is in the abnormal state, and the broken straight lines are the approximate straight line La1 of the voltage change associated with the first constant current and the approximate straight line La2 of the voltage change associated with the second constant current. Both of the approximate straight line La1 and the approximate straight line La2 are also straight lines obtained by the processing of step S4.

Referring to FIG. 6, it can be seen that the gradients of the approximate straight lines Ln1 and Ln2 of the power storage device 10 in the normal state are greater relative to the gradients of the approximate straight lines La1 and La2 of the power storage device 10 in the abnormal state.

The reason for this is that, in the power storage device 10 in the normal state, the discharge resistance Rpr is larger and the self-discharge current Ipr is smaller compared with the power storage device 10 in the abnormal state, and thus, the charge tends to be accumulated with ease in the electrostatic capacitance Cst of the power storage unit 13 shown in FIG. 1. As described above, as the constant current is supplied to the power storage device 10, the voltage change in the power storage device 10 tends to be enhanced as discharge resistance Rpr of the power storage device 10 is increased.

For example, when the self-discharge current Ipr of the power storage device 10 in the normal state is to be calculated, the controller 4 in this embodiment acquires the first current value I1, the gradient of the approximate straight line Ln1, the second current value I2, and the gradient of the approximate straight line Ln2, and substitutes them into the above-described equation (4). As described above, it is possible to obtain the self-discharge current Ipr of the power storage device 10 by supplying the constant current having current values different from each other to the power storage device 10 and by obtaining the gradient for the voltage change for every constant current.

After obtaining the self-discharge current Ipr of the power storage device 10, the controller 4 determines whether the power storage device 10 is being passed/failed on the basis of the self-discharge current Ipr. As shown in FIG. 3, the controller 4 may determine, for every constant current, whether or not the gradient of the approximate straight line falls between the upper limit value and the lower limit value, and the controller 4 may determine whether the power storage device 10 is in the normal state or in the abnormal state on the basis of the determination result.

In this embodiment, although the controller 4 detects the gradients for two voltage changes by switching the level of the constant current to be supplied to the positive electrode 11 of the power storage device 10 from the constant-current source 2 in order to calculate the self-discharge current Ipr of the power storage device 10, the present invention is not limited thereto. For example, a connection relationship between the constant-current source 2 and the power storage device 10 may be inverted, the constant current may be supplied to the negative electrode 12 of the power storage device 10 from the constant-current source 2 to discharge the power storage device 10, and in this state, the level of the constant current to be supplied to the power storage device 10 may be switched. Also in this case, as in the above-mentioned embodiment, it is possible to calculate the self-discharge current Ipr of the power storage device 10.

Next, operational advantages according to the second embodiment will be described.

The inspection apparatus 1 formed by the measurement apparatus for the power storage device 10 is provided with the constant-current source 2 that supplies the constant current the power storage device 10 and the voltage sensor 3 that measures the voltage of the power storage device 10. The inspection apparatus 1 is further provided with the controller 4 that computes the self-discharge current Ipr of the power storage device 10 or the discharge resistance Rpr of the power storage device 10 through which the self-discharge current Ipr flows on the basis of the voltage change in the power storage device 10 subjected to the measurement.

In addition, the inspection method included in the measurement method of the power storage device 10 includes: the supply step (S1) in which the constant current is supplied to the power storage device 10; and the measurement step (S2, S3) in which the voltage of the power storage device 10 is measured. The inspection method further includes the control step (S4, S41 to S43, and S50) in which the self-discharge current Ipr of the power storage device 10 or the discharge resistance Rpr of the power storage device 10 through which the self-discharge current Ipr flows is calculated on the basis of the voltage change in the power storage device 10 subjected to the measurement.

In contrast to these configurations, by utilizing the general inspection method described in JP2015-072148A, it is also possible to obtain the self-discharge related parameters such as the self-discharge current of the secondary battery, the discharge resistance of the secondary battery through which the self-discharge current flows, or the like on the basis of a lowered amount of the voltage in the secondary battery during the aging time. However, in order to obtain such parameters, it is required to store the secondary battery for a period of several days to several weeks as the aging time until the voltage is lowered due to the self discharge.

Therefore, according to the above-described configuration of the inspection apparatus 1 and the inspection method in the second embodiment, because the voltage change in the power storage device 10 is enhanced by supplying the constant current to the power storage device 10 from the constant-current source 2, it is possible to detect the voltage change in the power storage device 10 at a high accuracy within a short time. Thus, the controller 4 can obtain the self-discharge related parameters such as the self-discharge current Ipr or the discharge resistance Rpr of the power storage device 10 within a short time.

For example, in the calculation method of the self-discharge current Ipr, if the electrostatic capacitance Cst of the power storage unit 13 in the above-described equation (1) is known, the gradient A1 of the approximate straight line for the voltage change in the power storage device 10 is detected at the time when the constant current indicating the first current value I1 is charged to the power storage device 10. By substituting the value of the known electrostatic capacitance Cst, the first current value I1, and the detected value of the gradient A1 into the above-described equation (1), it is possible to calculate the self-discharge current Ipr of the power storage device 10.

Alternatively, premeasured values or estimated values may be respectively substituted into the electrostatic capacitance Cst of the power storage unit 13 and the first current value I1 in the above-described equation (1). Then, in the above-described equation (1), a numerical value of either one of the gradient A1 for the voltage change and the self-discharge current Ipr may be assigned to generate the association table indicating the relationship between the gradient A1 and the self-discharge current Ipr, and this association table may be stored in the controller 4 in advance. In this case, when the gradient A1 for the voltage change in the power storage device 10 is obtained, the controller 4 refers to the association table to calculate the self-discharge current Ipr associated with the obtained gradient A1 of the approximate straight line.

In addition, the discharge resistance Rpr of the power storage device 10 is calculated by dividing the open circuit voltage (OCV) of the power storage device 10 by the self-discharge current Ipr. Therefore, if the open circuit voltage (OCV) of the power storage device 10 is known, the association table indicating the relationship between the gradient A1 for the voltage change and the discharge resistance Rpr may be generated and the association table may be stored in the controller 4. In this case, when the gradient A1 for the voltage change in the power storage device 10 is obtained, the controller 4 refers to the association table to calculate the discharge resistance Rpr associated with the obtained gradient A1 of the approximate straight line.

As described above, because the self-discharge current Ipr or the discharge resistance Rpr of the power storage device 10 can be obtained by using the voltage change in the power storage device 10 detected within a short time, the controller 4 can obtain the self-discharge related parameters of the power storage device 10 within a short time.

In addition, the controller 4 in the inspection apparatus 1 in this embodiment is provided with the current switching unit 42 that switches the constant current to be supplied to the power storage device 10. The computing unit 46 of the controller 4 computes the self-discharge current Ipr or the discharge resistance Rpr of the power storage device 10 on the basis of the voltage change in the power storage device 10 measured by the voltage sensor 3 for every constant current supplied to the power storage device 10.

According to this configuration, because the voltage change in the power storage device 10 is detected for every constant current by switching the level of the constant current to be supplied to the power storage device 10, the controller 4 can calculate the self-discharge current Ipr of the power storage device 10 by using the above-described equation (4). As described above, because the measured value of the power storage device 10 that is the measurement object can be obtained by using the self-discharge related parameters, compared with a case in which the association table described above is used, it is possible to suppress errors in the self-discharge related parameters calculated.

In addition, the current switching unit 42 in the inspection apparatus 1 in this embodiment switches the constant current to be supplied to the power storage device 10 between the first constant current for detecting the self-discharge current Ipr of the power storage device 10 and the second constant current that is higher than the first constant current.

According to this configuration, because the voltage change in the power storage device 10 is enhanced as the current switching unit 42 causes the constant-current source 2 to supply the second constant current that is higher than the first constant current to the power storage device 10, it is possible to obtain the gradient for the voltage change at a high accuracy within a short time. Furthermore, because a signal-to-noise ratio (S/N ratio) of a voltage signal detected by the voltage sensor 3 is increased, it is possible to increase the accuracy of the calculation of the gradient for the voltage change.

Especially, the second constant current supplied from the constant-current source 2 to the power storage device 10 is preferably be set to at least several ten times the reference value of the self-discharge current Ipr of the power storage device 10. By performing such a setting, it is possible to reduce the error for the calculation result involved by omitting the self-discharge current Ipr in the above-described equation (2).

In addition, in this embodiment, the first constant current to be supplied to the power storage device 10 is preferably be set to one or several times the reference value of the self-discharge current Ipr of the power storage device 10. By setting the first constant current as described above, it is possible to ensure an estimation accuracy of the self-discharge current Ipr of the power storage device 10 that is calculated by using the above-described equation (4). In addition, because an allowable range of the first constant current is relatively wide, it is possible to suppress deterioration of the estimation accuracy of the self-discharge current Ipr involved with setting error of the first constant current.

In addition, as in the above-described equation (1), the computing unit 46 in this embodiment may compute the self-discharge current Ipr of the power storage device 10 on the basis of the current value I1 of the constant current to be supplied to the power storage device 10, the gradient A1 for the voltage change in the power storage device 10, and the electrostatic capacitance Cst of the power storage unit 13.

By doing so, the self-discharge current Ipr can be obtained without switching the constant current, and therefore, it is possible to obtain the self-discharge related parameters of the power storage device 10 within a shorter time. The electrostatic capacitance Cst of the power storage unit 13 may be calculated in advance by using the above-described equation (2) or may be obtained from the statistical data of the power storage device 10.

At this time, the constant current supplied from the constant-current source 2 to the power storage device 10 is set to a level that is lower than the overpotential and at which the electrical double layer reaction is mainly caused in the power storage device 10. By doing so, it is possible to obtain the self-discharge current Ipr with a high accuracy, and at the same time, it is possible to reduce a power consumption of the constant-current source 2.

In addition, the computing unit 46 in this embodiment is provided with the leakage-current computing unit 461 that computes the self-discharge current Ipr of the power storage device 10 by obtaining the gradient for the voltage change in the power storage device 10 for every constant current and by using the respective gradients A1 and A2 for the voltage change and the respective current values I1 and I2 for the constant current. Furthermore, the computing unit 46 is provided with the discharge resistance computing unit 462 that computes the discharge resistance Rpr of the power storage device 10 on the basis of the self-discharge current Ipr computed by the leakage-current computing unit 461.

According to this configuration, by using the respective gradients A1 and A2 for the voltage change obtained for every constant current and the respective current values I1 and I2 of the constant current, it is possible to calculate the discharge resistance Rpr of the power storage device 10.

In addition, the controller 4 in this embodiment is further provided with the device determination unit 47 that determines that the power storage device 10 is normal on the basis of the self-discharge current Ipr or the discharge resistance Rpr computed by the computing unit 46. With such a configuration, by using the self-discharge related parameters computed by the computing unit 46, it is possible to determine whether the power storage device 10 is in the normal state or in the abnormal state.

Third Embodiment

Next, the inspection apparatus 1 according to a third embodiment will be described. The configuration of the inspection apparatus 1 according to this embodiment is the same as the configuration shown in FIG. 1, and also, the functional configuration of the controller 4 configuring the inspection apparatus 1 is essentially the same as the functional configuration shown in FIG. 4.

The inspection apparatus 1 in this embodiment differs from the second embodiment in which the level of the constant current is switched in that the direction of the constant current to be supplied to the power storage device 10 from the constant-current source 2 is switched.

Similarly to the second embodiment, the first current value I1 and the second current value I2 are stored in the constant-current value storage unit 451 of the controller 4, and in this embodiment, the second current value I2 is set such that the second constant current flows in the opposite direction relative to the first constant current.

For example, the first current value I1 is set to a positive value such that the constant current is charged to the power storage device 10, and the second current value I2 is set to a negative value such that the constant current is discharged from the power storage device 10. For the first current value I1 and the second current value I2, it suffices that the absolute value of at least one of the first current value I1 and the second current value I2 is set to one or several times the reference value of the self-discharge current Ipr, and the absolute values of the first current value I1 and the second current value I2 may have the same value with each other or different values from each other.

In this embodiment, the first current value I1 is set to one or several times the reference value of the self-discharge current Ipr. In other words, the first current value I1 is set to the current value for detecting the self-discharge current Ipr of the power storage device 10. For example, the first current value I1 is set to 10 [μA] that is one times the reference value of the self-discharge current Ipr, and the second current value I2 is set to the value obtained by multiplying the first current value I1 by "−1", i.e., −10 [μA].

After the current switching unit 42 acquires the second current value I2 after acquiring the first current value I1 from the constant-current value storage unit 451, the current switching unit 42 then instructs the constant-current source 2 via the current command unit 43 such that the second constant current having the same level and flowing in the opposite direction relative to the first constant current is supplied to the power storage device 10. By doing so, the constant-current source 2 supplies the first constant current to the positive electrode 11 of the power storage device 10 to charge the power storage device 10, and thereafter, the constant-current source 2 supplies the first constant current to the negative electrode 12 of the power storage device 10 as the second constant current to discharge the power storage device 10.

As described above, the current switching unit 42 forms the switching means that switches the constant current to be supplied to the power storage device 10 between the first constant current for detecting the self-discharge current Ipr and the second constant current that flows in the opposite direction relative to the first constant current.

In this embodiment, although the controller 4 controls the operation of the constant-current source 2 such that the direction of the current is switched, the present invention is not limited thereto. For example, a switcher may be connected between the constant-current source 2 and the power storage device 10 as the switching means, and the connection relationship between the constant-current source 2 and the power storage device 10 may be inverted by sending a switching command from the controller 4 to the switcher.

Next, the method of computing the self-discharge current Ipr of the power storage device 10 according to this embodiment will be described.

Similarly to the above-described equation (1), the numerical equation for obtaining the electrostatic capacitance Cst of the power storage unit 13 can be expressed as in the following equation (5) by using the self-discharge current Ipr of the power storage device 10 and the gradient Ac for the voltage change at the time when the power storage device 10 is charged with the constant current indicating the first current value I1.

[Numerical Equation 5]

$$C_{st} = \frac{I_1 - I_{pr}}{A_c} \quad (5)$$

Furthermore, the numerical equation for obtaining the electrostatic capacitance Cst of the power storage unit 13 can be expressed as in the following equation (6) by using the self-discharge current Ipr of the power storage device 10 and the gradient Ad for the voltage change at the time when the power storage device 10 is discharged by the constant current indicating the second current value I2.

[Numerical Equation 6]

$$C_{st} = \frac{I_2 + I_{pr}}{A_d} \quad (6)$$

Next, by solving the above-described equation (5) and equation (6) for the self-discharge current Ipr, the following equation (7) is derived.

[Numerical Equation 7]

$$I_{pr} = \frac{I_1 \cdot A_d - I_2 \cdot A_c}{A_d + A_c} \quad (7)$$

Therefore, by substituting the above-mentioned parameters into the equation (7), it is possible to calculate the self-discharge current Ipr of the power storage device 10.

Therefore, the leakage-current computing unit 461 of this embodiment obtains: the gradient Ac for the voltage change during the charging associated with the first constant current; and the gradient Ad for the voltage change during the discharge associated with the second constant current, and acquires the first current value I1 and the second current value I2 from the constant-current value storage unit 451. The leakage-current computing unit 461 calculates the self-discharge current Ipr by substituting these parameters into the above-described equation (7). The leakage-current computing unit 461 outputs the calculated self-discharge current Ipr of the power storage device 10 to the discharge resistance computing unit 462.

Figure 7:
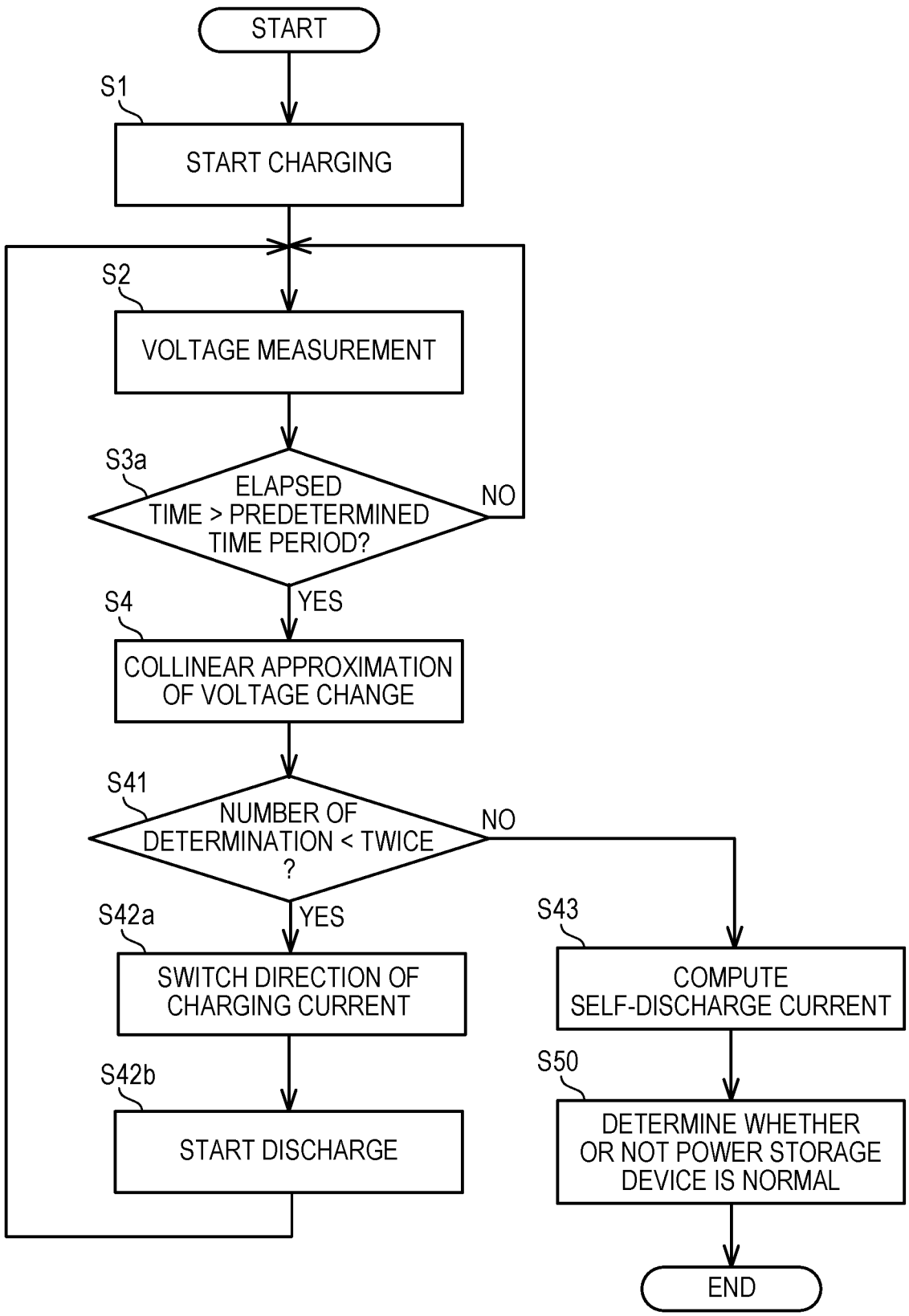
FIG. 7 is a flowchart of an inspection method according to a third embodiment.
Figure 8:
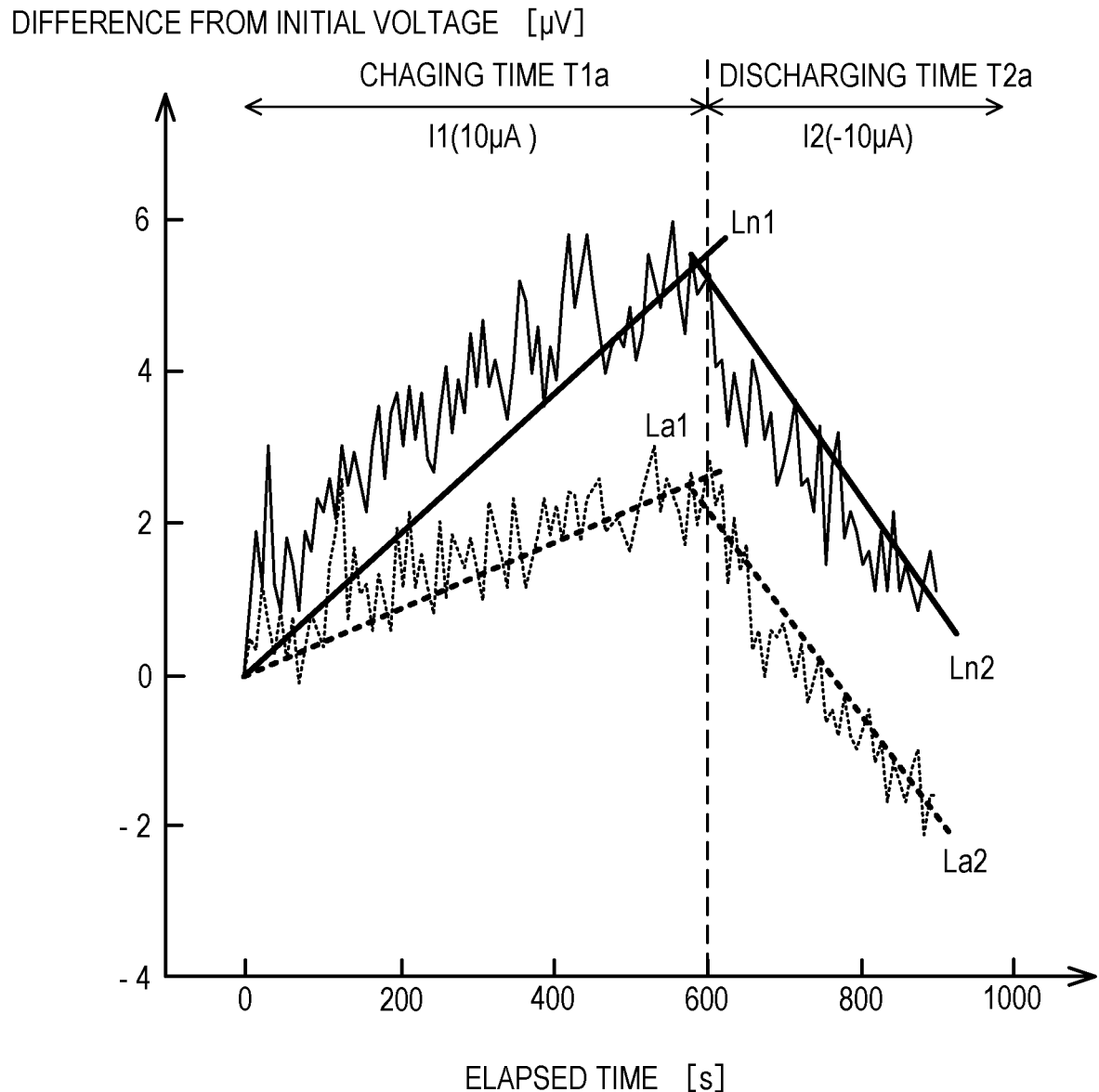
FIG. 8 is a diagram showing an example of the voltage change against a supply time in a state in which the direction of the constant current supplied to the power storage device is switched.

Next, the inspection method including the measurement method of the power storage device 10 according to the third embodiment will be described with reference to FIGS. 7 and 8. FIG. 7 is a flowchart showing an example of the processing procedure of the inspection method using the inspection apparatus 1. FIG. 8 is a diagram showing an example of the voltage change against the elapsed time after the constant current is supplied to the power storage device 10.

The inspection method in this embodiment includes processing of steps S3a, S42a, and S42b instead of the processing of steps S3 and S42 in the processing procedure shown in FIG. 5.

In step S1, the inspection of the power storage device 10 is started by starting the charging by connecting the inspection apparatus 1 to the power storage device 10, and by supplying the constant current from the constant-current source 2 to the first current value I1.

In step S2, the controller 4 causes the voltage sensor 3 to measure the voltage (the initial voltage) of the power storage device 10. The electric signal corresponding to the voltage value of the power storage device 10 detected by the voltage sensor 3 is input to the controller 4.

In step S3a, the controller 4 determines whether or not the predetermined time period has exceeded the elapsed time since the start of the supply of the constant current. The predetermined time period is set in advance to such a duration that the difference becomes apparent in the voltage change between the case in which the power storage device 10 is normal and the case in which the power storage device 10 is abnormal. When it is determined that the elapsed time has exceeded the predetermined time period in step S3a, the process proceeds to step S4. On the other hand, when it is determined that the elapsed time has not exceeded the predetermined time period in step S3a, the process returns to step S2, and the voltage of the power storage device 10 is measured again.

In step S4, the controller 4 detects the voltage change in the power storage device 10 on the basis of the voltage of the power storage device 10 measured by the voltage sensor 3. Specifically, the controller 4 obtains the approximate straight line for the voltage change in the power storage device 10 during the charging on the basis of the initial voltage at the start of charging and the charging voltage in a state in which the constant current is supplied from the constant-current source 2. More specifically, the controller 4 obtains the approximate straight line for the voltage change using, for example, the least squares analysis on the basis of the voltage values of the power storage device 10 measured at every control period.

In step S41, the controller 4 determines whether or not the number of determination that is the number of times the approximate straight line for the measured voltage change has been obtained is less than twice. When it is determined that the number of determination is less than twice in step S41, it is required to switch the constant current to be supplied to the power storage device 10, and so, the process proceeds to step S42a.

In step S42a, the controller 4 switches the direction of the constant current to be supplied to the power storage device 10. In this embodiment, the controller 4 switches the constant current to be supplied to the power storage device 10 to the second constant current having the same level and flowing in the opposite direction relative to the first constant current.

In step S42b, the controller 4 starts the discharge by supplying the constant current indicating the second current value I2 from the constant-current source 2. Thereafter, the process returns to step S2, and the controller 4 measures a discharge voltage that is the voltage of the power storage device 10 for only the predetermined time period, and in step S4, the controller 4 obtains the approximate straight line for the discharge-voltage change associated with the second constant current.

When it is determined that the number of determination has reached twice in step S41, the parameters required for the computation of the self-discharge current Ipr of the power storage device 10 are now obtained, and so, the process proceeds to step S43 in the controller 4.

In step S43, the controller 4 computes the self-discharge current Ipr of the power storage device 10 on the basis of the gradient for the voltage change in the power storage device 10 obtained for every constant current supplied to the power storage device 10. In this embodiment, the controller 4 calculates the self-discharge current Ipr of the power storage device 10 by using, as the above-mentioned parameters, the first current value I1, the gradient Ac of the approximate straight line for the charging voltage change, the second current value I2, and the gradient Ad of the approximate straight line for the discharge-voltage change.

As described above, steps S41, S42a, S42b, and S43 are executed by the controller 4 as the control steps that compute the self-discharge current Ipr of the power storage device 10 on the basis of the voltage change in the power storage device 10 subjected to the measurement.

In step S50, as described in the second embodiment, the controller 4 determines whether or not the power storage device 10 is in the normal state on the basis of the self-discharge current Ipr of the power storage device 10.

By executing the above-described processing, the pass/fail determination of the power storage device 10 is completed.

In the example shown in FIG. 7, the controller 4 calculated the self-discharge current Ipr of the power storage device 10 by obtaining the gradient for the voltage change in the power storage device 10 twice by switching the direction of the constant current to be supplied to the power storage device 10 only once. Instead, the controller 4 may calculate a plurality of self-discharge currents Ipr by successively obtaining the gradients of the approximate straight lines for the voltage change by switching the direction of the constant current a plurality of times, and the controller 4 may then use statistical values, such as the average value, the median, or the like of the calculated values as the final result.

Next, the processing of step S43 will be described with reference to a specific example shown in FIG. 8. The horizontal axis in FIG. 8 indicates the elapsed time [s] since the start of the charging of the power storage device 10, and the vertical axis indicates the difference [μV] between the voltage detected by the voltage sensor 3 and the initial voltage.

A predetermined charging time T1a is a time period during which the power storage device 10 is charged with the constant current indicating the first current value I1, and a predetermined discharge time T2a is a time period during which the power storage device 10 is charged with the constant current indicating the second current value I2 after the switching. The first current value I1 is 10 [μA], and the second current value I2 is −10 [μA].

The data shown by the solid line in FIG. 8 indicates the voltage change when the power storage device 10 is in the normal state, and the solid straight lines respectively indicate the approximate straight line Ln1 of the voltage change associated with the first constant current and the approximate straight line Ln2 of the voltage change associated with the second constant current. Both of the approximate straight line Ln1 and the approximate straight line Ln2 are straight lines obtained by the processing of step S4.

On the other hand, the data shown by the dotted line in FIG. 8 indicates the voltage change when the power storage device 10 is in the abnormal state, and the broken straight lines are the approximate straight line La1 of the voltage change associated with the first constant current and the approximate straight line La2 of the voltage change associated with the second constant current. Both of the approximate straight line La1 and the approximate straight line La2 are straight lines obtained by the processing of step S4.

Referring to FIG. 8, similarly to FIG. 6, it can be seen that the absolute values of the gradients of the approximate straight lines Ln1 and Ln2 of the power storage device 10 in the normal state are greater relative to the absolute values of the gradients of the approximate straight lines La1 and La2 of the power storage device 10 in the abnormal state.

For example, when the self-discharge current Ipr of the power storage device 10 in the normal state is to be calculated, the controller 4 in this embodiment acquires the first current value I1, the gradient of the approximate straight line Ln1, the second current value I2, and the absolute value of the gradient of the approximate straight line Ln2, and substitutes them into the above-described equation (7). As described above, it is possible to obtain the self-discharge current Ipr of the power storage device 10 by supplying the constant currents to the power storage device 10 in the direction different from each other and by obtaining the gradient for the voltage change for every constant current.

After obtaining the self-discharge current Ipr of the power storage device 10, the controller 4 determines whether the power storage device 10 is being passed/failed on the basis of the obtained self-discharge current Ipr. As shown in FIG. 3, the controller 4 may determine, for every constant current, whether or not the gradient of the approximate straight line falls between the upper limit value and the lower limit value, and the controller 4 may determine whether the power storage device 10 is in the normal state or in the abnormal state on the basis of the determination result.

Next, operational advantages according to the third embodiment will be described.

The current switching unit 42 according to this embodiment switches the constant current to be supplied to the power storage device 10 between the first constant current for detecting the self-discharge current Ipr and the second constant current that flows in the opposite direction relative to the first constant current.

According to this configuration, by switching the direction of the constant current to be supplied to the power storage device 10, the voltage change in the power storage device 10 is detected for every constant current, and so, it is possible to calculate the self-discharge current Ipr of the power storage device 10 by utilizing the numerical equation, etc. such as the above-described equation (7).

As described above, because the self-discharge related parameters are obtained by using the plurality of measured values for the voltage change in the power storage device 10, which is the measurement object, there is no need to use assumed values of the electrostatic capacitance Cst of the power storage unit 13 in the power storage device 10. Thus, the controller 4 can suppress estimation errors in the parameters compared with a case in which the self-discharge related parameters of the power storage device 10 are estimated by using the assumed values of the electrostatic capacitance Cst.

In addition, the constant-current source 2 in this embodiment supplies the first constant current to the positive electrode 11 of the power storage device 10 and supplies the first constant current to the negative electrode 12 of the power storage device 10 as the second constant current. According to this configuration, because there is no need to change the level of the constant current and it is only required to invert the connection between the power storage device 10 and the constant-current source 2, it is possible to perform the inspection of the power storage device 10 with ease.

Although the embodiments of the present invention have been described in the above, the above-mentioned embodiments merely illustrate a part of application examples of the present invention, and the technical scope of the present invention is not intended to be limited to the specific configurations of the above-described embodiments.

For example, the controller 4 may switch the direction of the constant current after switching the level of the constant current to be supplied to the power storage device 10, or alternatively, the controller 4 may switch the level of the constant current after switching the direction of the constant current to be supplied to the power storage device 10. In this case, because the plurality of self-discharge current Ipr are obtained, the average value thereof, etc. may be used as the final result.

In addition, as the internal state of the power storage device 10, the power storage device 10 is determined as being passed/failed in the first embodiment, and the self-discharge current Ipr and the discharge resistance Rpr of the power storage device 10 are computed in the second and third embodiments; however, the present invention is not limited thereto.

For example, an extent of the voltage change in the power storage device 10 changes in accordance with the internal temperature of the power storage device 10. By utilizing this nature, a temperature table indicating the relationship between the voltage change in the power storage device 10 and the internal temperature may be stored in the controller 4 in advance, and the controller 4 may estimate the internal temperature of the power storage device 10 on the basis of the voltage change in the power storage device 10.

In addition, the controller 4 may calculate the electrostatic capacitance Cst of the power storage unit 13 shown in FIG. 1. For example, the controller 4 calculates the electrostatic capacitance Cst of the power storage unit 13 by substituting the gradient A2 for the voltage change at the time when the power storage device 10 is charged with the constant current indicating the second current value I2 and the second current value I2 into the above-described equation (2). In addition, the controller 4 may determine the internal state of the power storage device 10 on the basis of the calculated electrostatic capacitance Cst. For example, the controller 4 determines whether the power storage device 10 is being passed/failed by determining whether or not the calculated value of the electrostatic capacitance Cst falls within a predetermined the normal range.

As described above, the controller 4 can compute the internal state of the power storage device 10 on the basis of the voltage change in the power storage device 10.

In addition, in the above-mentioned embodiment, although the internal state of single power storage device 10 is measured, it is possible to measure the internal state of the power storage module in which a plurality of power storage devices 10 are connected in series. In addition, although the inspection apparatus 1 shown in FIG. 1 includes the display unit 5, the display unit 5 may be omitted.

The present application claims priorities based on Japanese Patent Application 2019-139656 and Japanese Patent Application 2019-139659 filed with the Japan Patent Office on Jul. 30, 2019, the entire contents of which are incorporated into this specification by reference.

REFERENCE SIGNS LIST 1 inspection apparatus
2 constant-current source (constant current supply means)
3 voltage sensor (voltage measuring means)
4 controller (control means)
10 power storage device
13 power storage unit
14 internal resistance
15 parallel resistance
42 current switching unit (switching means)
46 computing unit (control means)
47 device determination unit (determination means)

The invention claimed is:

1. A measurement apparatus of a power storage device comprising:
    a constant current supply device configured to supply constant current to the power storage device;
    a voltage measuring device configured to measure voltage of the power storage device; and
    a controller configured to compute an internal state of the power storage device based on a voltage change in the power storage device subjected to measurement,
    wherein the constant current supply device is configured to supply at least the constant current to the power storage device by setting the constant current to be one or several times a reference value of a self-discharge current of the power storage device, and
    further wherein the voltage measuring device is configured to measure the voltage of the power storage device subjected to measurement at least twice.

2. The measurement apparatus of the power storage device according to claim 1, wherein
    the measurement apparatus is an inspection apparatus configured to perform an inspection of self-discharge in the power storage device,
    the voltage measuring device is configured to measure the voltage of the power storage device subjected to measurement once in a state in which the constant current is supplied from the constant current supply device, and
    the controller is configured to detect the voltage change in the power storage device based on the voltage of the power storage device subjected to measurement and determine that the power storage device is normal when the voltage change falls within a normal range.

3. The measurement apparatus of the power storage device according to claim 1, wherein
    the voltage measuring device is configured to measure an initial voltage at a start of supply of the constant current and a charging voltage in a state in which the constant current is supplied from the constant current supply device, and
    the controller is configured to detect the voltage change in the power storage device based on the initial voltage and the charging voltage.

4. A measurement apparatus of a power storage device comprising:
    a constant current supply device configured to supply constant current to the power storage device;
    a voltage measuring device configured to measure voltage of the power storage device; and a controller configured to compute an internal state of the power storage device based on a voltage change in the power storage device subjected to measurement, further wherein the voltage measuring device is configured to measure the voltage of the power storage device subjected to measurement at least twice, the controller is configured to compute, based on the voltage change in the power storage device subjected to measurement, a self-discharge current of the power storage device or a discharge resistance of the power storage device through which the self-discharge current flows.

5. The measurement apparatus of the power storage device according to claim 4, wherein the controller is provided with a switching unit configured to switch the constant current to be supplied to the power storage device, wherein the controller is configured to compute the self-discharge current or the discharge resistance based on the voltage change in the power storage device measured by the voltage measuring device for every constant current supplied to the power storage device.

6. The measurement apparatus of the power storage device according to claim 5, wherein the switching unit is configured to switch the constant current to be supplied to the power storage device between a first constant current for detecting the self-discharge current and a second constant current higher than the first constant current.

7. The measurement apparatus of the power storage device according to claim 6, wherein the switching unit is configured to switch the constant current to be supplied to the power storage device between a first constant current for detecting the self-discharge current and a second constant current flowing in an opposite direction relative to the first constant current.

8. The measurement apparatus of the power storage device according to claim 5, wherein the controller is configured to compute the self-discharge current of the power storage device based on a current value of the constant current to be supplied to the power storage device, a gradient for the voltage change in the power storage device, and a capacity component of the power storage device.

9. The measurement apparatus of the power storage device according to claim 5, wherein the controller is provided with:

a current computing unit configured to obtain a gradient for the voltage change in the power storage device for every constant current supplied to the power storage device, the current computing unit being also configured to compute the self-discharge current of the power storage device by using respective gradients for the voltage change and respective current values of the constant current; and a resistance computing unit configured to compute the discharge resistance of the power storage device based on the self-discharge current computed by the current computing unit.

10. The measurement apparatus of the power storage device according to claim 4, wherein the controller is provided with determination unit, the determination unit being configured to determine that the power storage device is normal based on the self-discharge current calculated or the discharge resistance calculated.

11. A measurement method of a power storage device comprising:

supplying constant current to the power storage device;

measuring voltage of the power storage device; and computing an internal state of the power storage device based on a voltage change in the power storage device subjected to measurement, wherein in the supplying, at least the constant current to the power storage device is set to be one or several times a reference value of a self-discharge current of the power storage device, and in the measuring, the voltage of the power storage device subjected to measurement is measured at least twice.

12. The measurement method of the power storage device according to claim 11, wherein the measurement method includes an inspection method that includes performing an inspection of self-discharge in the power storage device, and the computing, includes detecting the voltage change in the power storage device based on the voltage of the power storage device subjected to measurement and determining that the power storage device is normal when the voltage change falls within a normal range.

13. The measurement method of the power storage device according to claim 12, wherein the computing includes computing the self-discharge current of the power storage device or a discharge resistance of the power storage device through which the self-discharge current flows based on the voltage change in the power storage device subjected to measurement.

14. The measurement method of the power storage device according to claim 11, wherein the computing includes computing the self-discharge current of the power storage device or a discharge resistance of the power storage device through which the self-discharge current flows based on the voltage change in the power storage device subjected to measurement.

* * * * *